United States Patent
Iwao et al.

(10) Patent No.: US 9,341,952 B2
(45) Date of Patent: *May 17, 2016

(54) SUBSTRATE TREATMENT METHOD, NON-TRANSITORY COMPUTER STORAGE MEDIUM AND SUBSTRATE TREATMENT SYSTEM

(71) Applicant: Tokyo Electron Limited, Tokyo (JP)

(72) Inventors: Fumiko Iwao, Nirasaki (JP); Satoru Shimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/188,774

(22) Filed: Feb. 25, 2014

(65) Prior Publication Data

US 2014/0255844 A1    Sep. 11, 2014

(30) Foreign Application Priority Data

Mar. 6, 2013 (JP) .................. 2013-044427

(51) Int. Cl.
*G03F 7/20* (2006.01)
*G03F 7/40* (2006.01)

(52) U.S. Cl.
CPC ...................... *G03F 7/405* (2013.01)

(58) Field of Classification Search
CPC ........ G03F 7/405; G03F 7/40; H01L 21/0337
USPC ........................................ 430/324
See application file for complete search history.

(56) References Cited

U.S. PATENT DOCUMENTS

| 6,017,683 A | 1/2000 | Endo et al. | |
|---|---|---|---|
| 2002/0036183 A1* | 3/2002 | Shibata | 216/44 |
| 2004/0081762 A1 | 4/2004 | Tsushima | |
| 2012/0152752 A1* | 6/2012 | Keigler et al. | 205/118 |
| 2014/0170332 A1* | 6/2014 | Iwao et al. | 427/553 |
| 2014/0255852 A1* | 9/2014 | Iwao et al. | 430/325 |

FOREIGN PATENT DOCUMENTS

| EP | 1 375 699 A1 | 1/2004 |
|---|---|---|
| JP | H04-151668 A | 5/1992 |
| JP | H07-326562 A | 12/1995 |
| JP | 08-076385 A | 3/1996 |
| JP | 09-189998 A | 7/1997 |
| JP | 2000-243741 A | 9/2000 |
| JP | 2001-272786 A | 10/2001 |
| JP | 2003-519434 A | 6/2003 |
| JP | 2005-322765 A | 11/2005 |
| JP | 2010-278254 A | 12/2010 |
| JP | 2012-022244 A | 2/2012 |
| WO | 00/01010 A2 | 1/2000 |

OTHER PUBLICATIONS

U.S. Office Action mailed on Sep. 30, 2015 in the corresponding U.S. Appl. No. 14/098,653.

* cited by examiner

*Primary Examiner* — Daborah Chacko Davis
(74) *Attorney, Agent, or Firm* — Posz Law Group, PLC

(57) ABSTRACT

In the present invention, photolithography processing is performed on a substrate to form a resist pattern over the substrate, and a treatment agent is caused to enter a side surface of the resist pattern and metal is caused to infiltrate the side surface of the resist pattern via the treatment agent, the formed resist pattern has a high etching selection ratio with respect to a film to be treated on the substrate so as to suppress a so-called pattern collapse, therefore.

18 Claims, 16 Drawing Sheets

FIG.8
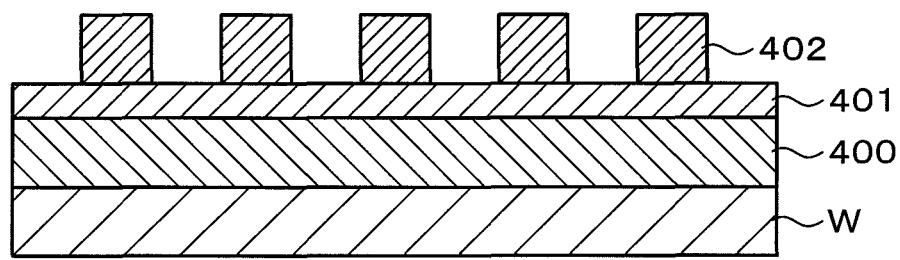
(a)
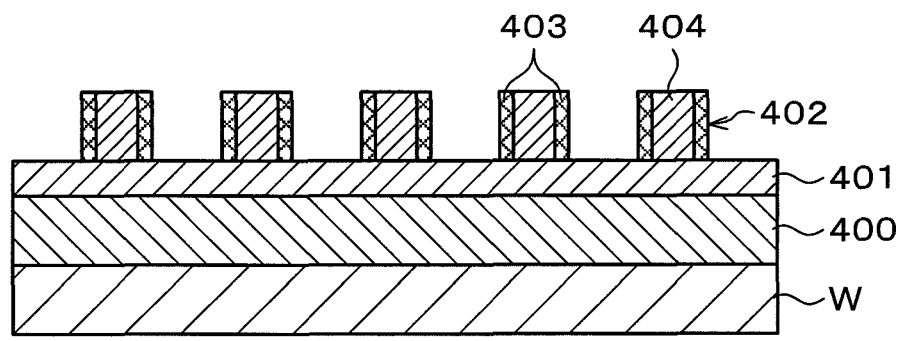
(b)
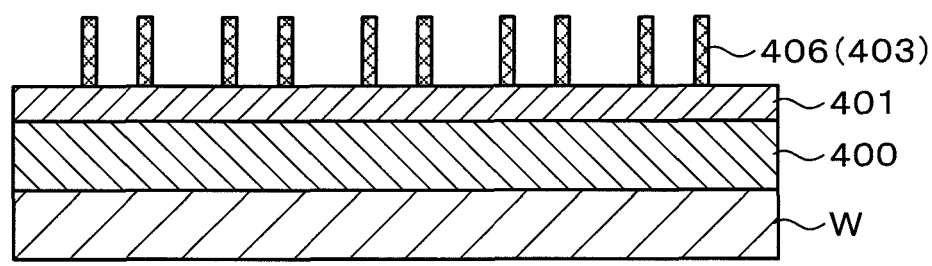
(c)
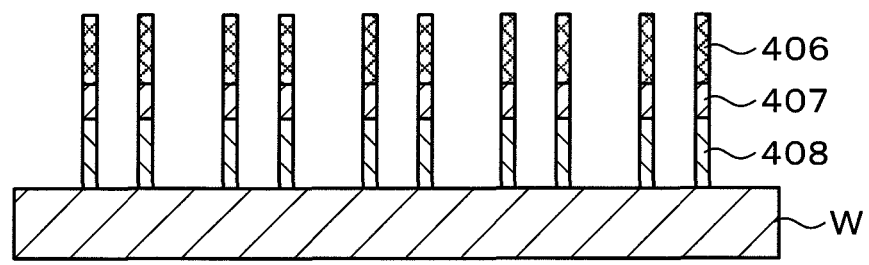
(d)

FIG.13
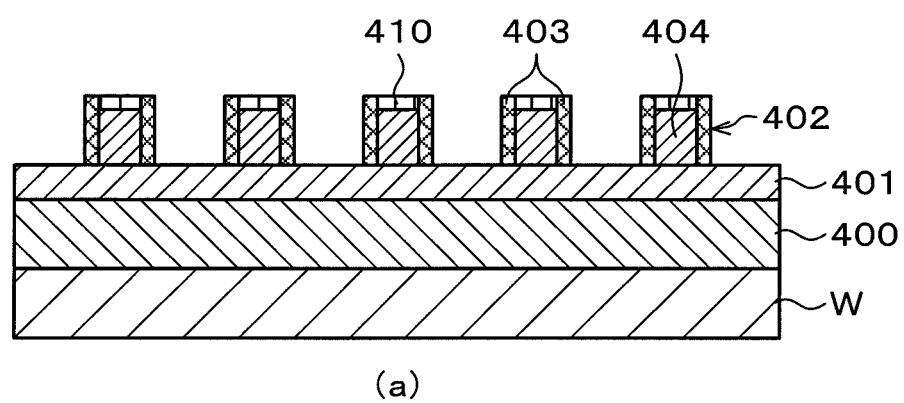
(a)
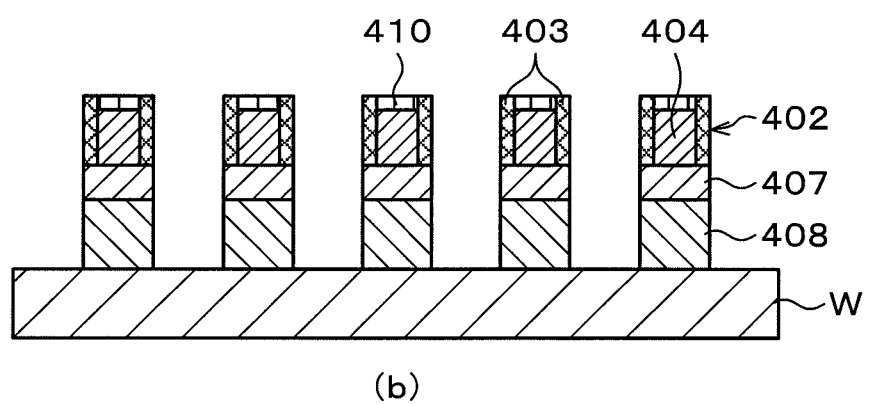
(b)

SUBSTRATE TREATMENT METHOD, NON-TRANSITORY COMPUTER STORAGE MEDIUM AND SUBSTRATE TREATMENT SYSTEM

BACKGROUND OF THE INVENTION

1. Field of the Invention

The present invention relates to a substrate treatment method of forming a resist pattern over a substrate, a non-transitory computer storage medium, and a substrate treatment system for executing the substrate treatment method.

This application is based upon and claims the benefit of priority of the prior Japanese Patent Application No. 2013-44427, filed in Japan on Mar. 6, 2013, the entire contents of which are incorporated herein by reference.

2. Description of the Related Art

In a photolithography process in a manufacturing process of a semiconductor device, for example, a resist coating treatment of applying a resist solution onto a film to be treated on a surface of a semiconductor wafer (hereinafter, referred to as a "wafer") to form a resist film, exposure processing of irradiating the resist film over the wafer with light in a predetermined pattern to expose the resist film, a developing treatment of developing the exposed resist film and so on are performed in sequence to form a predetermined resist pattern over the wafer. Then, after the resist pattern forming treatment, the film to be treated is etched using the resist pattern as a mask, whereby a predetermined pattern is formed in the film to be treated.

Semiconductor devices in recent years are miniaturized to be, for example, 20 nm or less, and the aforementioned resist pattern is required to be miniaturized. With the resist pattern in the current state, however, there is a limit to increasing the etching selection ratio with respect to the film to be treated and thus it is becoming difficult to ensure the accuracy of the etching technique.

Hence, it is proposed that a silicon film achieving a high etching selection ratio with respect to the film to be treated is formed under the resist film in order to improve the accuracy of the etching technique (Japanese Translation of PCT Application Publication No. 2003-519434). In this case, after the photolithography processing is performed to form a resist pattern in the resist film over the wafer, the silicon film is etched using the resist pattern as a mask, whereby a predetermined pattern in the silicon film. Thereafter, the film to be treated is etched using the pattern of the silicon film as a mask.

Incidentally, along with the above-described miniaturization of the resist pattern, the aspect ratio of the resist pattern increases to easily cause a so-called pattern collapse in which the resist pattern tilts to collapse. In this regard, in the method discussed in Japanese Translation of PCT Application Publication No. 2003-519434, the etching for the silicon film is performed using the resist pattern as a mask, so that there is a possibility that the pattern collapse occurs. Further, in the case of etching the film to be treated using the method described in Japanese Translation of PCT Application Publication No. 2003-519434, it is necessary to form the silicon film and etch the silicon film, thereby making the process of wafer treatment complicated.

SUMMARY OF THE INVENTION

The present invention has been made in consideration of the above points, and its object is to form a resist pattern over a substrate appropriately and efficiently.

To achieve the above object, the present invention is a substrate treatment method of forming a resist pattern over a substrate, the method including: a resist pattern forming step of performing photolithography processing on a substrate to form a resist pattern over the substrate; and a metal treatment step of causing a treatment agent to enter a side surface of the resist pattern and causing metal to infiltrate the side surface of the resist pattern via the treatment agent.

Here, by performing photolithography processing on a substrate to form a resist pattern over the substrate in the resist pattern forming step, a so-called intermediately exposed region is formed in a side surface of the resist pattern. In the photolithography processing, after the formation of the resist film over the substrate, the resist film it exposed and the exposed resist film is developed with a developing solution. In this manner, the resist pattern is basically formed of a portion which has not been exposed of the resist film but remains without being dissolved in the developing solution. At least the side surface of the resist pattern, however, has been actually exposed to a small extent. In other words, in the side surface of the resist pattern, a region having an intermediate characteristic between a soluble layer and an insoluble layer where a small amount of soluble groups are generated though it should be a region insoluble in the developing solution, namely, the aforementioned intermediately exposed region is formed. Thus, in the intermediately exposed region, OH groups (hydroxyl groups) are generated due to the exposure.

According to the present invention, by causing the treatment agent to enter the side surface of the resist pattern in the metal treatment step, metal can be caused to enter the side surface of the resist pattern using the treatment agent as an entrance route. The metal bonds with the OH groups in the intermediately exposed region of the side surface of the resist pattern, and thereby infiltrates the side surface of the resist pattern. As described above, the resist pattern containing the metal has a high etching selection ratio with respect to the film to be treated on the substrate. Accordingly, even if the height of a resist pattern is small (even if the thickness of a resist film is small), the resist pattern sufficiently fulfills the function as a mask at the time when etching the film to be treated. This makes it possible to decrease the aspect ratio of the resist pattern to thereby suppress the pattern collapse and appropriately form the resist pattern over the substrate.

In addition, it is unnecessary to separately form and etch a silicon film as in the prior art but it is only necessary to improve the quality of the resist pattern. Therefore, the wafer treatment can be simplified and the throughput of the wafer treatment can be improved.

Consequently, according to the present invention, a resist pattern can be appropriately and efficiently formed over a substrate.

The present invention according to another aspect is a non-transitory computer readable storage medium storing a program running on a computer of a control unit that controls a substrate treatment system to cause the substrate treatment system to execute the substrate treatment method.

The present invention according to still another aspect is a substrate treatment system for forming a resist pattern over a substrate, the system including: a resist film forming apparatus configured to form a resist film over a substrate; an exposure apparatus configured to expose the resist film formed in the resist film forming apparatus; a developing apparatus configured to develop the resist film exposed in the exposure apparatus to form a resist pattern over the substrate; and a metal treatment apparatus configured to cause a treatment agent to enter a side surface of the resist pattern and cause metal to infiltrate the side surface of the resist pattern via the treatment agent.

BRIEF DESCRIPTION OF THE DRAWINGS

FIG. 8 is an explanatory view of a wafer treatment, (a) illustrating an appearance in which a first resist pattern is formed over a wafer, (b) illustrating an appearance in which metal has infiltrated an intermediately exposed region of the first resist pattern, (c) illustrating an appearance in which a second resist pattern is formed over the wafer, and (d) illustrating an appearance in which a predetermined pattern is formed in a film to be treated;

FIG. 13 is an explanatory view of a wafer treatment according to another embodiment, (a) illustrating an appearance in which metal has infiltrated the intermediately exposed region and the exposed region of the first resist pattern over the wafer, and (b) illustrating an appearance in which a predetermined pattern is formed in the film to be treated;

DETAILED DESCRIPTION OF THE INVENTION

Figure 1:
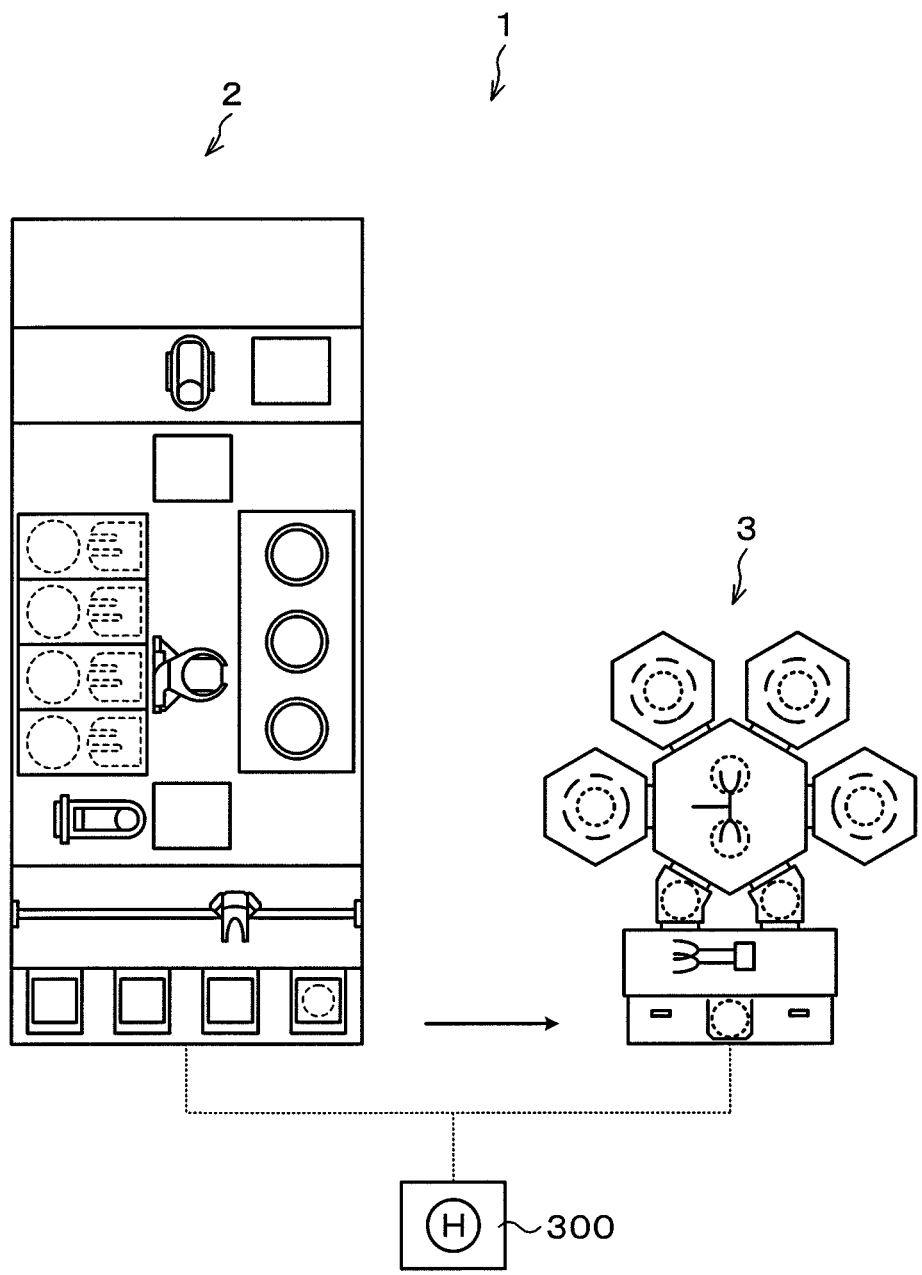
FIG. 1 is an explanatory view illustrating the outline of a configuration of a substrate treatment system according an embodiment.

Hereinafter, an embodiment of the present invention will be described. FIG. 1 is an explanatory view illustrating the outline of a configuration of a substrate treatment system 1 according to this embodiment. Note that a film to be treated has been preliminarily formed on a wafer as a substrate to be treated in the substrate treatment system 1 according to this embodiment.

The substrate treatment system 1 has a coating and developing treatment apparatus 2 that performs photolithography processing on the wafer and an etching treatment apparatus 3 that performs etching treatment on the wafer W as illustrated in FIG. 1.

Figure 2:
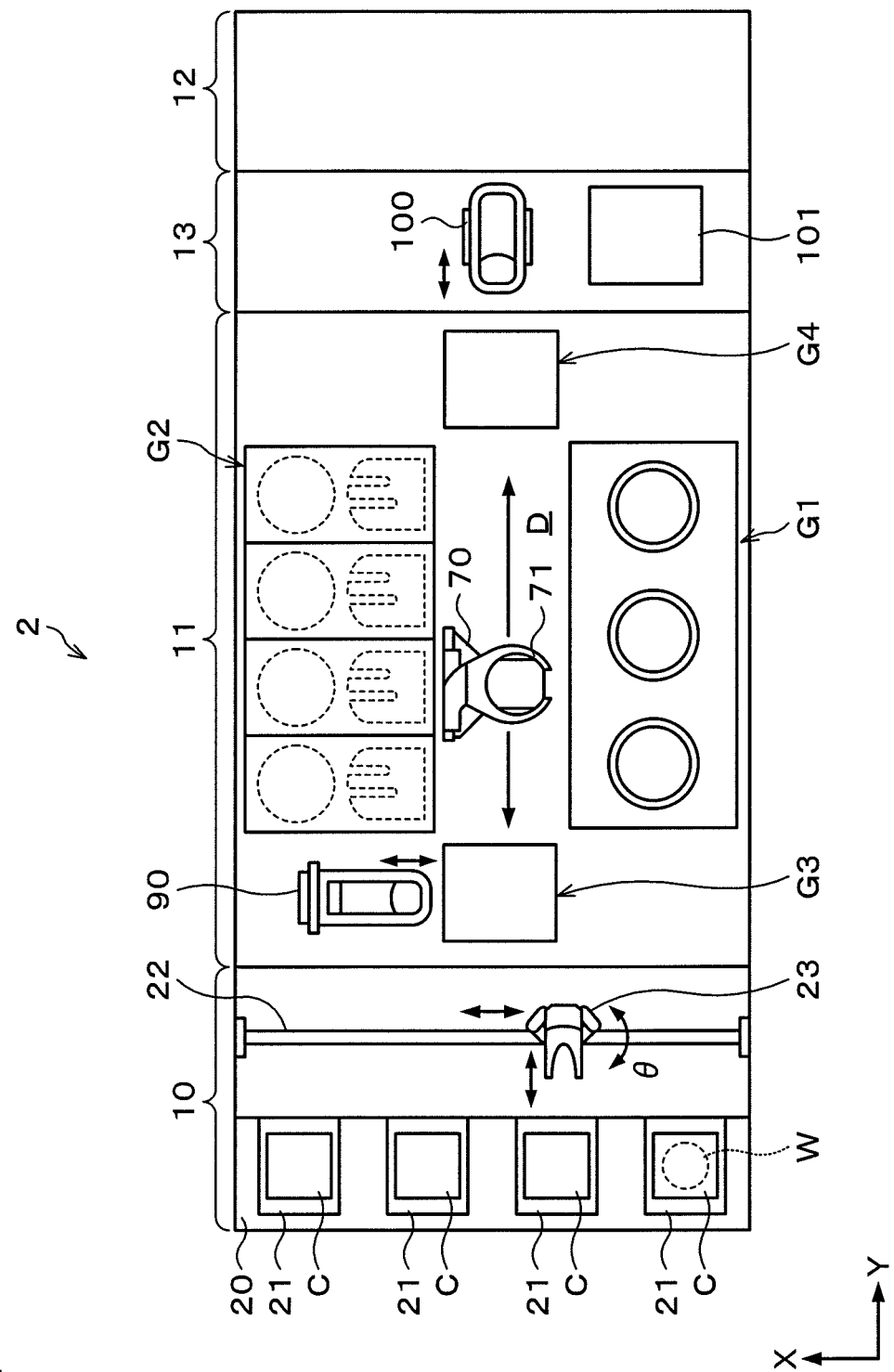
FIG. 2 is a plan view illustrating the outline of a configuration of a coating and developing treatment apparatus.

The coating and developing treatment apparatus 2 has, as illustrated in FIG. 2, a configuration in which, for example, a cassette station 10 to/from which a cassette C housing a plurality of wafers W is transferred in/out from/to, for example, the outside, a treatment station 11 including a plurality of various kinds of treatment apparatuses that perform predetermined treatments in a manner of single wafer treatment in the photolithography processing, and an interface station 13 that delivers the wafer W to/from an exposure apparatus 12 adjacent to the treatment station 11, are integrally connected.

In the cassette station 10, a cassette mounting table 20 is provided. The cassette mounting table 20 is provided with, a plurality of, for example, four cassette mounting plates 21. The cassette mounting plates 21 are provided, arranged side by side in a line in an X-direction (a top and bottom direction in FIG. 2) being the horizontal direction. On the cassette mounting plates 21, cassettes C can be mounted when the cassettes C are transferred in/out from/to the outside of the coating and developing treatment apparatus 2.

In the cassette station 10, a wafer transfer apparatus 23 is provided which is movable on a transfer path 22 extending in the X-direction as illustrated in FIG. 2. The wafer transfer apparatus 23 is movable also in the vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (an X-direction negative direction side in FIG. 2) in the treatment station 11, and the second block G2 is provided on the rear side (an X-direction positive direction side in FIG. 2) in the treatment station 11. Further, the third block G3 is provided on the cassette station 10 side (a Y-direction negative direction side in FIG. 2) in the treatment station 11, and the fourth block G4 is provided on the interface station 13 side (a Y-direction positive direction side in FIG. 2) in the treatment station 11.

Figure 3:
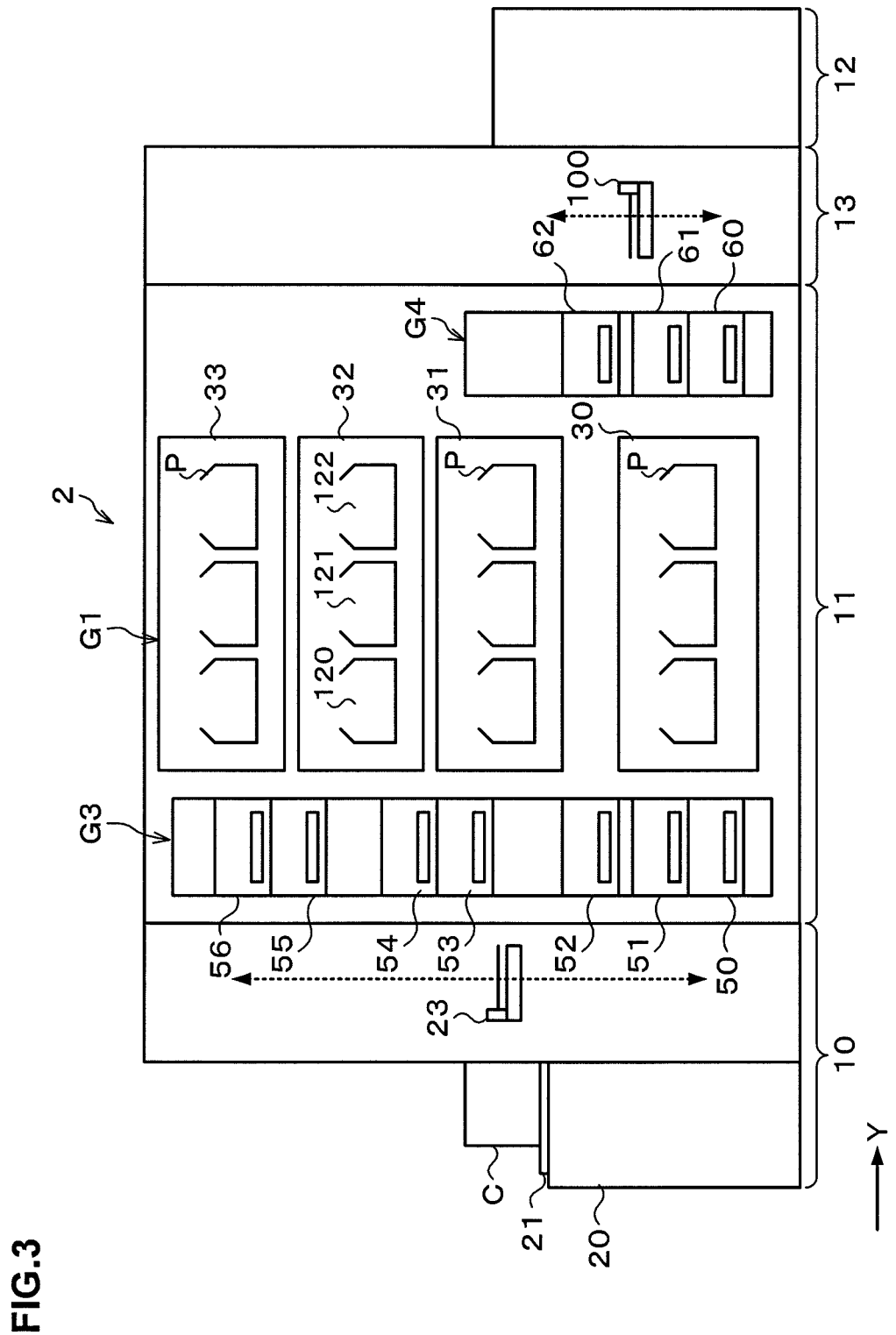
FIG. 3 is a side view illustrating the outline of an internal configuration of the coating and developing treatment apparatus.

For example, in the first block. G1, as illustrated in FIG. 3, a plurality of solution treatment apparatuses are stacked in the vertical direction. For example, a developing apparatus 30 which performs developing treatment on the wafer W, a lower anti-reflection film forming apparatus 31 which forms an anti-reflection film under a resist film over the wafer W (hereinafter, referred to as a "lower anti-reflection film"), a coating treatment apparatus 32 which forms a resist film over the wafer W and causes metal to infiltrate a side surface of a first resist pattern, and an upper anti-reflection film forming apparatus 33 which forms an anti-reflection film over the resist film over the wafer W (hereinafter, referred to as an "upper anti-reflection film"), are four-tiered in order from the bottom. Note that the coating treatment apparatus 32 functions as a resist film forming apparatus and functions as a metal treatment apparatus in the present invention.

Each of the developing apparatus 30, the lower anti-reflection film forming apparatus 31 and the upper anti-reflection film forming apparatus 33 has a plurality of cups P, each of which houses the wafer W therein at treatment, in the horizontal direction, and can treat a plurality of wafers W in parallel. The detailed configuration of the coating treatment apparatus 32 will be described later.

The numbers and the arrangement of the developing apparatus 30, the lower anti-reflection film forming apparatus 31, the coating treatment apparatus 32, and the upper anti-reflection film forming apparatus 33 can be arbitrarily selected. Further, a protective film forming apparatus which supplies a treatment solution for forming a water repellent protective film to the wafer W to form a protective film for exposure, a rear surface cleaning apparatus which supplies a cleaning solution to a rear surface and a beveled portion at the edge of the wafer W to clean the rear surface of the wafer W, and the like may be arranged in the first block. G1.

Figure 4:
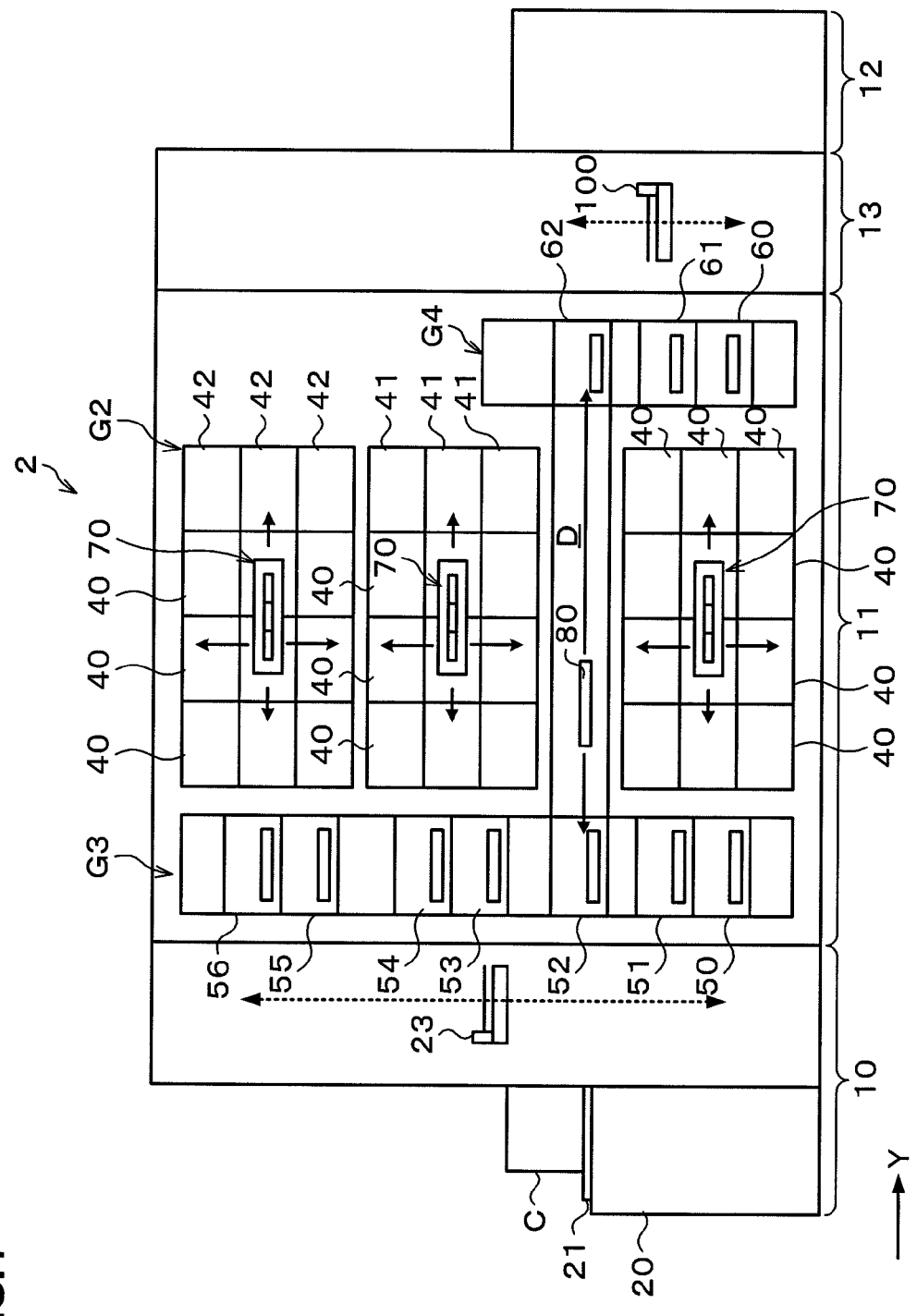
FIG. 4 is a side view illustrating the outline of the internal configuration of the coating and developing treatment apparatus.

For example, in the second block G2, as illustrated in FIG. 4, thermal treatment apparatuses 40 each of which performs thermal treatment on the wafer W, adhesion apparatuses 41 each of which performs hydrophobic treatment on the wafer W, and edge exposure apparatuses 42 each of which exposes the outer peripheral portion of the wafer W are arranged one on top of the other in the vertical direction and side by side in the horizontal direction. The thermal treatment apparatus 40 has a thermal plate which mounts and heats the wafer W thereon and a cooling plate which mounts and cools the wafer W thereon, and thereby can perform both of heat treatment and cooling treatment. Note that the numbers and the arrangement of the thermal treatment apparatuses 40, the adhesion apparatuses 41, and the edge exposure apparatuses 42 can be arbitrarily selected.

For example, in the third block G3, a plurality of delivery apparatuses 50, 51, 52, 53, 54, 55, 56 are provided in order from the bottom as illustrated in FIG. 3 and FIG. 4. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 2. In the wafer transfer region D, for example, a wafer transfer apparatus 70 is arranged.

The wafer transfer apparatus 70 has a transfer arm 71 that is movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

A plurality of the wafer transfer apparatuses 70 are arranged, for example, one above the other as illustrated in FIG. 4 and can transfer the wafers W, for example, to predetermined apparatuses in the blocks G1 to G4 at about the same levels as them.

In the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction. The shuttle transfer apparatus 80 can move in the Y-direction while supporting the wafer W and transfer the wafer W between the delivery apparatus 52 in the third block G3 and the delivery apparatus 62 in the fourth block. G4.

As illustrated in FIG. 2, a wafer transfer apparatus 90 is provided adjacent on the X-direction positive direction side of the third block G3. The wafer transfer apparatus 90 has a transfer arm that is movable, for example, in the X-direction, the θ-direction, and the vertical direction. The wafer transfer apparatus 90 can move up and down while supporting the wafer W to transfer the wafer W to each of the delivery apparatuses in the third block G3.

In the interface station 13, a wafer transfer apparatus 100 and a delivery apparatus 101 are provided. The wafer transfer apparatus 100 has a transfer arm that is movable, for example, in the Y-direction, the θ-direction, and the vertical direction. The wafer transfer apparatus 100 can transfer the wafer W to/from each of the delivery apparatuses in the fourth block G4, the delivery apparatus 101 and the exposure apparatus 12 while supporting the wafer W by the transfer an.

Figure 5:
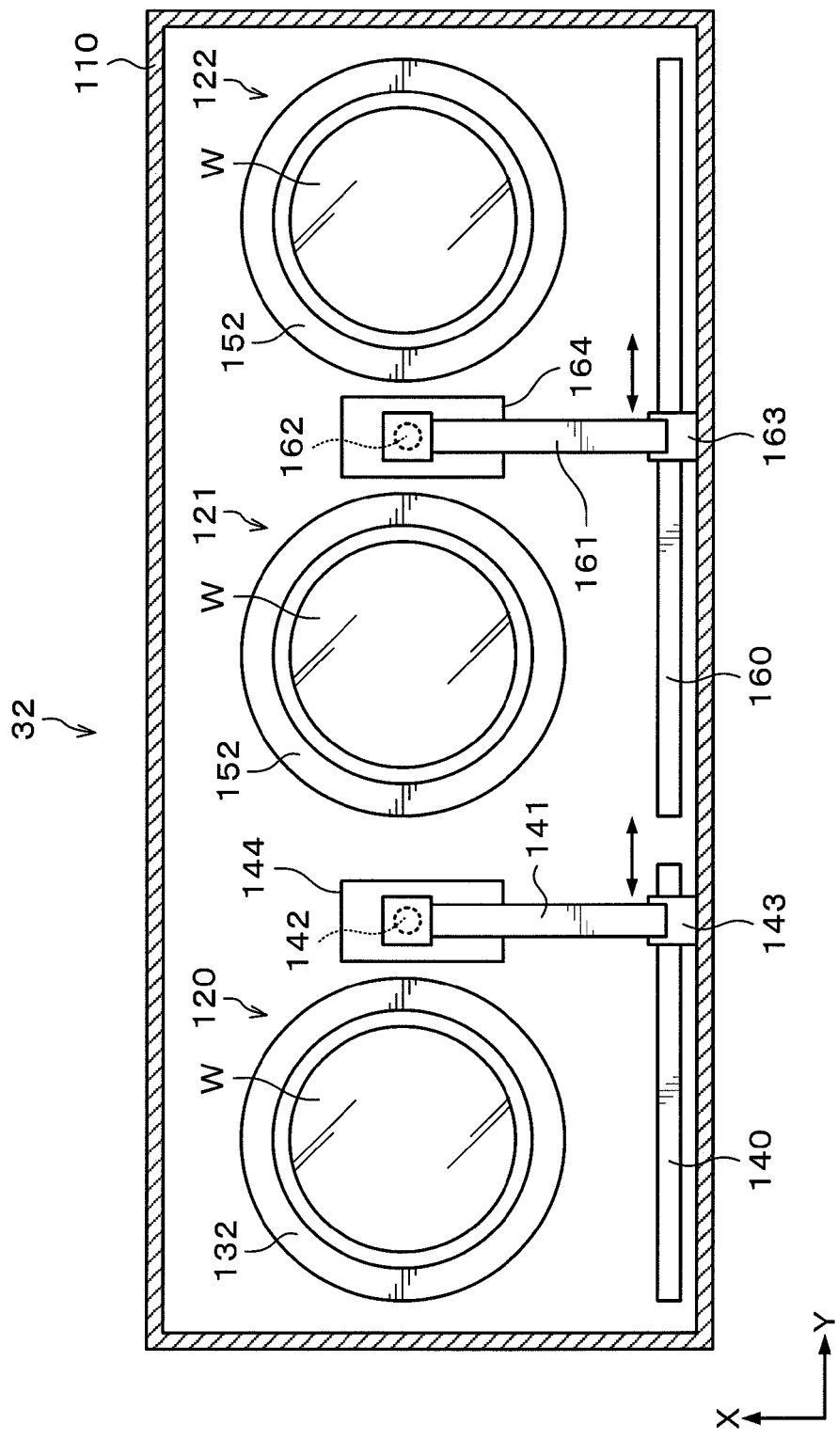
FIG. 5 is a transverse sectional view illustrating the outline of a configuration of a coating treatment apparatus.

Next, the configuration of the above-described coating treatment apparatus 32 will be described. The coating treatment apparatus 32 has a treatment container 110 which can hermetically close the inside as illustrated in FIG. 5. Transfer-in/out ports (not illustrated) for the wafers W are formed, for example, at three positions in a side surface on the wafer transfer region D side of the treatment container 110, and opening/closing shutters (not illustrated) are provided at the transfer-in/out ports. The three transfer-in/out ports are formed at positions corresponding to later-described metal treatment unit 120 and resist film forming units 121, 122. Note that the metal treatment unit 120 functions as a metal treatment apparatus in the present invention, and the resist film forming units 121, 122 function as the resist film forming apparatuses in the present invention.

Inside the treatment container 110, for example, the metal treatment unit 120 which causes alcohol as a treatment agent to enter an intermediately exposed region which has been formed in a side surface of a first resist pattern over the wafer W and causes metal to infiltrate the intermediately exposed region via the alcohol, and the two resist film forming units 121, 122 each of which forms the resist film over the wafer W are provided as described later. The metal treatment unit 120 and the resist film forming units 121, 122 are arranged side by side in this order from a. Y-direction negative direction (a left direction in FIG. 5) side to a Y-direction positive direction (a right direction in FIG. 5) side.

Figure 6:
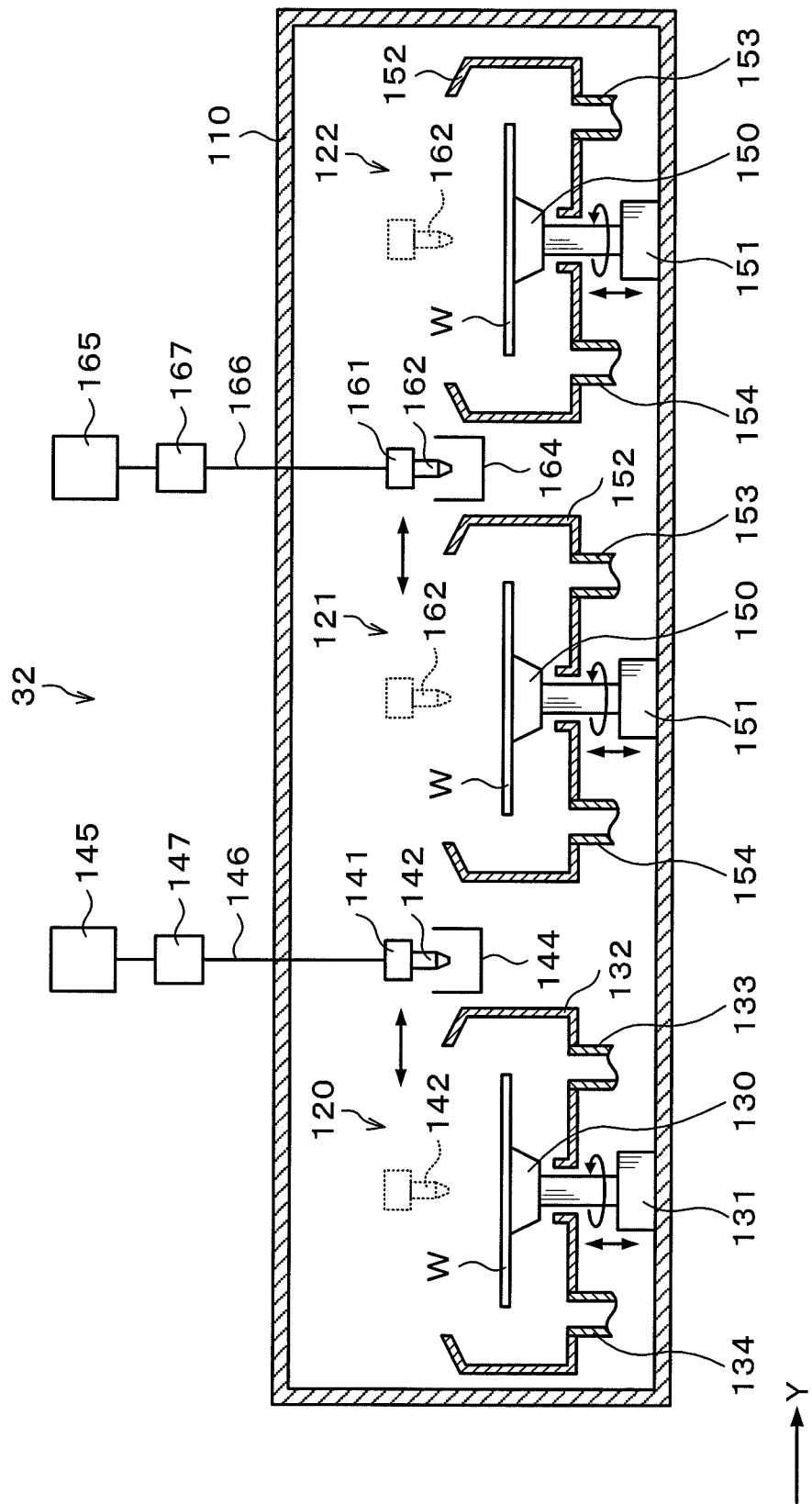
FIG. 6 is a longitudinal sectional view illustrating the outline of the configuration of the coating treatment apparatus.

At the metal treatment unit 120, a spin chuck 130 is provided which holds and rotates the wafer W thereon as illustrated in FIG. 6. The spin chuck 130 has a horizontal upper surface, and the upper surface is provided with, for example, a suction port (not illustrated) sucking the wafer W. By suction through the suction port, the wafer W can be suction-held on the spin chuck 130.

Below the spin chuck. 130, a chuck drive part 131 equipped with, for example, a motor and the like is provided. The spin chuck 130 can rotate at a predetermined speed by means of the chuck drive part 131. Further, the chuck drive part 131 is provided with a raising and lowering drive source such as, for example, a cylinder so that the spin chuck 130 can freely rise and lower.

Around the spin chuck 130, a cup 132 is provided which receives and collects liquid splashing or dropping from the wafer W. A drain pipe 133 that drains the collected liquid and an exhaust pipe 134 that exhausts the atmosphere in the cup 132 are connected to the lower surface of the cup 132.

As illustrated in FIG. 5, on an X-direction negative direction (a lower direction in FIG. 5) side of the cup 132, a rail 140 extending along a Y-direction (a right-left direction in FIG. 5) is formed. The rail 140 is formed, for example, from a Y-direction negative direction (a left direction in FIG. 5) side outer position of the cup 132 to a Y-direction positive direction (a right direction in FIG. 5) side outer position. To the rail 140, for example, an arm 141 is attached.

On the arm 141, a metal-containing solution nozzle 142 as a metal-containing agent supply part is supported which supplies a metal-containing solution in a liquid form as a metal-containing agent onto the wafer W as illustrated in FIG. 5 and FIG. 6. The arm 141 is movable on the rail 140 by means of a nozzle drive part 143 illustrated in FIG. 5. Thus, the metal-containing solution nozzle 142 can move from a waiting section 144 provided at the Y-direction positive direction side outer position of the cup 132 to a position above a central portion of the wafer W in the cup 132, and further move in the diameter direction of the wafer W above wafer W above the wafer W. Further, the arm 141 can freely rise and lower by means of the nozzle drive part 143 to be able to adjust the height of the metal-containing solution nozzle 142.

To the metal-containing solution nozzle 142, a supply pipe 146 communicating with a metal-containing solution supply source 145 is connected as illustrated in FIG. 6. In the metal-containing solution supply source 145, the metal-containing solution is stored. The supply pipe 146 is provided with a supply equipment group 147 including a valve, a flow regulator and so on for controlling the flow of the metal-containing solution.

In the metal-containing solution supply source 145, the metal-containing solution made by dissolving metal in alcohol as a treatment agent is stored. As the alcohol, for example, IPA (isopropyl alcohol), ethanol, butanol, MIBC (methyl isobutyl carbinol) or the like is used. Further, as the metal, for example, Zr (zirconium), Ti (titanium), W (tungsten) or the like is used. Note that this metal is a nanoparticle having a small diameter, for example, a diameter of 5 nm or less.

At the resist film forming unit 121, a spin chuck 150 is provided which holds and rotates the wafer W thereon as illustrated in FIG. 6. The spin chuck 150 has a horizontal upper surface, and the upper surface is provided with, for example, a suction port (not illustrated) sucking the wafer W. By suction through the suction port, the wafer W can be suction-held on the spin chuck 150.

Below the spin chuck 150, a chuck drive part 151 equipped with, for example, a motor and the like is provided. The spin chuck 150 can rotate at a predetermined speed by means of the chuck drive part 151. Further, the chuck drive part 151 is provided with a raising and lowering drive source such as, for example, a cylinder so that the spin chuck 150 can freely rise and lower.

Around the spin chuck 150, a cup 152 is provided which receives and collects liquid splashing or dropping from the wafer W. A drain pipe 153 that drains the collected liquid and an exhaust pipe 154 that exhausts the atmosphere in the cup 152 are connected to the lower surface of the cup 152.

Also in the resist film forming unit 122, a spin chuck 150, a chuck drive part 151, a cup 152, a drain pipe 153, and an exhaust pipe 154 are provided as in the above-described resist film forming unit 121.

As illustrated in FIG. 5, on an X-direction negative direction (a lower direction in FIG. 5) side of the cups 152 of the resist film forming units 121, 122, a rail 160 extending along the Y-direction (the right-left direction in FIG. 5) is formed. The rail 160 is formed, for example, from a Y-direction negative direction (a left direction in FIG. 5) side outer position of the cup 152 of the resist film forming unit 121 to a Y-direction positive direction (a right direction in FIG. 5) side outer position of the cup 152 of the resist film forming unit 122. To the rail 160, for example, an arm 161 is attached.

On the arm 161, a resist solution nozzle 162 is supported which supplies a resist solution to the wafer W as illustrated in FIG. 5 and FIG. 6. The arm 161 is movable on the rail 160 by means of a nozzle drive part 163 illustrated in FIG. 5. Thus, the resist solution nozzle 162 can move from a waiting section 164 provided between the cup 152 of the resist film forming unit 121 and the cup 152 of the resist film forming unit 122 to a position above a central portion of the wafer W in the cup 152, and further move in the diameter direction of the wafer W above the wafer W. Further, the arm 161 can freely rise and lower by means of the nozzle drive part 163 to be able to adjust the height of the resist solution nozzle 162.

To the resist solution nozzle 162, a supply pipe 166 communicating with a resist solution supply source 165 is connected as illustrated in FIG. 6. In the resist solution supply source 165, the resist solution is stored. The supply pipe 166 is provided with a supply equipment group 167 including a valve, a flow regulator and so on for controlling the flow of the resist solution.

Figure 7:
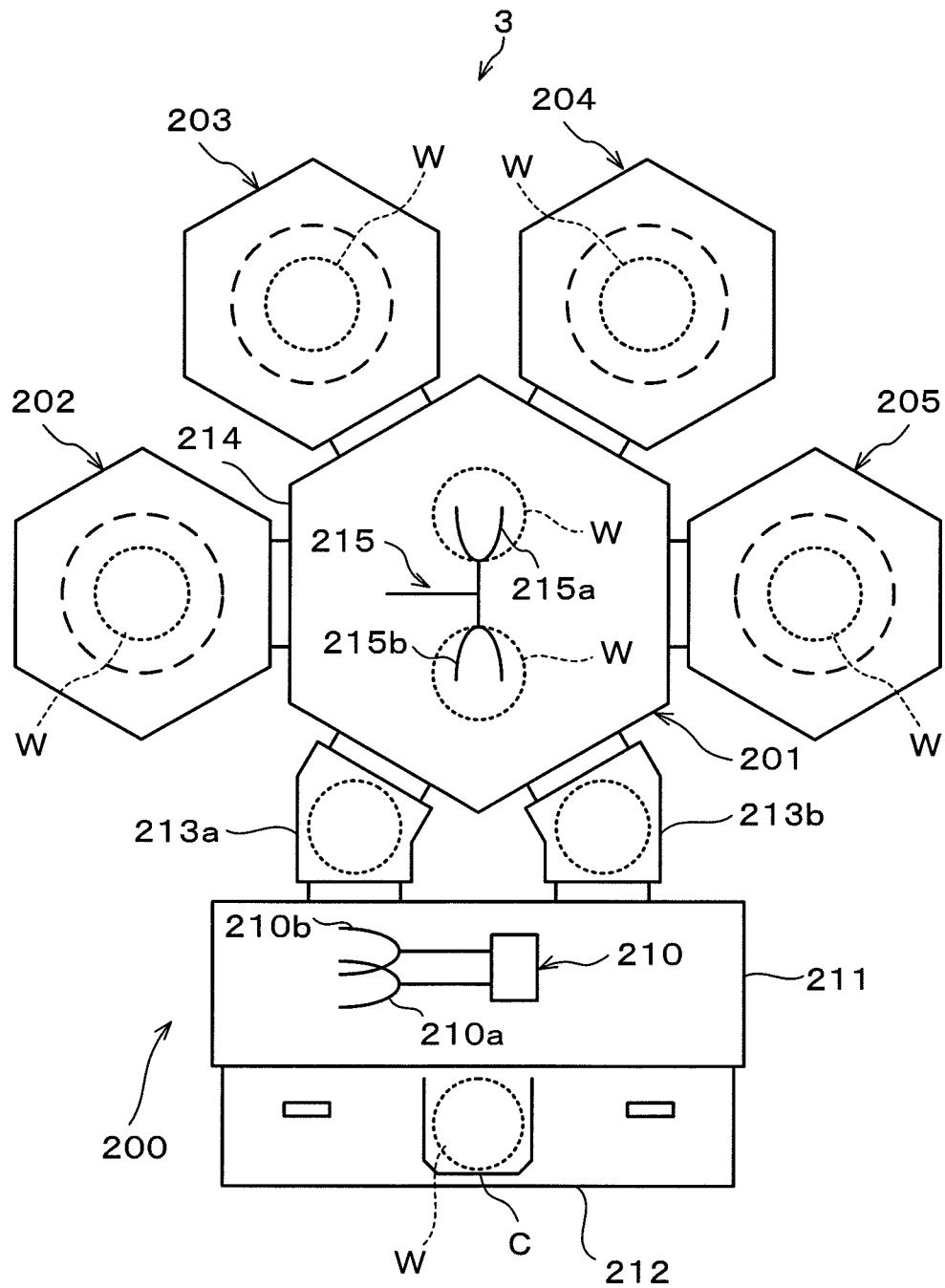
FIG. 7 is a plan view illustrating the outline of a configuration of an etching treatment apparatus.

Next, the configuration of the aforementioned etching treatment apparatus 3 will be described. The etching treatment apparatus 3 has, as illustrated in FIG. 7, a cassette station 200 to/from which the wafer W is transferred in/out to/from the etching treatment apparatus 3, a common transfer unit 201 which transfers the wafer W, first etching apparatuses 202, 203 as resist pattern removing apparatuses each of which removes an unexposed region which the metal has not infiltrated, located inside the intermediately exposed region of the first resist pattern over the wafer W as will be described later, and thereby forms a second resist pattern over the wafer W, and second etching apparatuses 204, 205 each of which etches the lower-anti reflection film and the film to be treated into a predetermined pattern using the second resist pattern over the wafer W as a mask.

The cassette station 200 has a transfer room 211 in which a wafer transfer mechanism 210 which transfers the wafer W is provided. The wafer transfer mechanism 210 has two transfer arms 210a and 210b each of which substantially horizontally holds the wafer W, and is configured to transfer the wafer W while holding the wafer W by one of the transfer arms 210a and 210b. On the side of the transfer room 211, a cassette mounting table 212 is provided on which a cassette C capable of housing a plurality of wafers W one above the other therein is mounted. In the illustrated example, a plurality of, for example, three cassettes C can be mounted on the cassette mounting table 212.

The transfer room 211 and the common transfer unit 201 are coupled to each other via two load-lock apparatuses 213a and 213b which can be evacuated.

The common transfer unit 201 has a transfer room chamber 214 having a closable structure formed in a substantially polygonal shape (a hexagonal shape in the illustrated example) as seen from above. In the transfer room chamber 214, a wafer transfer mechanism 215 which transfers the wafer W is provided. The wafer transfer mechanism 215 has two transfer arms 215a and 215b each of which substantially horizontally holds the wafer W, and is configured to transfer the wafer W while holding the wafer W by one of the transfer arms 215a and 215b.

Outside the transfer room chamber 214, the first etching apparatuses 202, 203, the second etching apparatuses 204, 205, and the load-lock apparatuses 213b, 213a are arranged to surround the periphery of the transfer room chamber 214. The first etching apparatuses 202, 203, the second etching apparatuses 204, 205, and the load-lock apparatuses 213b, 213a are arranged, for example, in this order in the clockwise direction as seen from above and opposed to six side surface portions of the transfer room chamber 214 respectively.

Note that as the first etching apparatuses 202, 203 and the second etching apparatuses 204, 205, for example, RIE (Reactive Ion Etching) apparatuses are used. Namely, in each of the first etching apparatuses 202, 203 and the second etching apparatuses 204, 205, dry etching of etching the resist film, the lower-anti reflection film, or the film to be treated is performed with reactive gas (etching gas), ion, or radical.

In the above substrate treatment system 1, a control unit 300 is provided as illustrated in FIG. 1. The control unit 300 is, for example, a computer and has a program storage unit (not illustrated). In the program storage unit, a program that controls the treatment on the wafer W in the substrate treatment system 1 is stored. Note that the program may be the one which is recorded, for example, on a non-transitory computer-readable storage medium such as a computer-readable hard disk (HD), flexible disk (FD), compact disk (CD), magneto-optical disk (MO), or memory card, and installed from the storage medium into the control unit 300.

Next, a treatment method of the wafer W performed using the substrate treatment system 1 configured as described above will be described. FIG. 8 schematically illustrates the state of the wafer W in steps of the wafer treatment. Note that as illustrated in FIG. 8(*a*), a film to be treated 400 has been preliminarily formed on the wafer W which will be treated in the substrate treatment system 1.

First, the cassette C housing a plurality of wafers W is transferred into the cassette station 10 of the coating and developing treatment apparatus 2 and mounted on a predetermined cassette mounting plate 21. Then, the wafers W in the cassette C are sequentially taken out by the wafer transfer apparatus 23 and transferred, for example, to the delivery apparatus 53 in the treatment station 11.

Then, the wafer W is transferred by the wafer transfer apparatus 70 to the thermal treatment apparatus 40 and temperature-regulated. Thereafter, the wafer W is transferred by the wafer transfer apparatus 70 to the lower anti-reflection film forming apparatus 31, in which a lower anti-reflection film 401 is formed over the wafer W as illustrated in FIG. 8(*a*). The wafer W is then transferred to the thermal treatment apparatus 40 and heated and temperature-regulated, and then returned back to the delivery apparatus 53.

Then, the wafer W is transferred by the wafer transfer apparatus 90 to the delivery apparatus 54. Thereafter, the wafer W is transferred by the wafer transfer apparatus 70 to the adhesion apparatus 41 and subjected to an adhesion treatment. The wafer W is then transferred by the wafer transfer apparatus 70 to the thermal treatment apparatus 40 and temperature-regulated. The wafer W is then transferred by the wafer transfer apparatus 70 to the resist film forming unit 121 in the coating treatment apparatus 32.

The wafer W transferred to the resist film forming unit 121 is suction-held by the spin chuck 150. Subsequently, the resist solution nozzle 162 at the waiting section 164 is moved by the arm 161 to the position above the central portion of the wafer W. Thereafter, while the wafer W is being rotated by the spin chuck. 150, the resist solution is supplied from the resist solution nozzle 162 to the central portion of the wafer W. The resist solution supplied over the wafer W is diffused over the entire front surface of the wafer W by the centrifugal force generated by the rotation of the wafer W. In this manner, the resist solution is applied over the wafer W to form into a resist film over the wafer W.

The wafer W is then transferred by the wafer transfer apparatus 70 to the thermal treatment apparatus 40 and subjected to pre-baking. The wafer W is then transferred by the wafer transfer apparatus 70 to the delivery apparatus 55.

Then, the wafer W is transferred by the wafer transfer apparatus 70 to the upper anti-reflection film forming apparatus 33, in which an upper anti-reflection film (not illustrated) is formed over the wafer W. The wafer W is then transferred by the wafer transfer apparatus 70 to the thermal treatment apparatus 40, and heated and temperature-regulated. The wafer W is then transferred by the wafer transfer apparatus 70 to the edge exposure apparatus 42, in which edge exposure processing is performed on the edge portion of the resist film over the wafer W.

The wafer W is then transferred by the wafer transfer apparatus 70 to the delivery, apparatus 56. The wafer W is then transferred by the wafer transfer apparatus 90 to the delivery apparatus 52 and transferred by the shuttle transfer apparatus 80 to the delivery apparatus 62.

The wafer W is then transferred by the wafer transfer apparatus 100 in the interface station 13 to the exposure apparatus 12. In the exposure apparatus 12, the resist film over the wafer W is irradiated with light and thereby selectively exposed to a predetermined pattern.

Then, the wafer W is transferred by the wafer transfer apparatus 100 from the exposure apparatus 12 to the delivery apparatus 60. Thereafter, the wafer W is transferred by the wafer transfer apparatus 70 to the thermal treatment apparatus 40 and subjected to post-baking.

The wafer W is then transferred by the wafer transfer apparatus 70 to the developing apparatus 30. In the developing apparatus 30, a developing solution is supplied onto the resist film over the wafer W and develop it. More specifically, the resist film exposed in the exposure apparatus 12 is selectively removed with the developing solution. Thus, the resist film which has not been exposed remains to form into a first resist pattern 402 over the wafer W as illustrated in FIG. 8(*a*).

Figure 9:
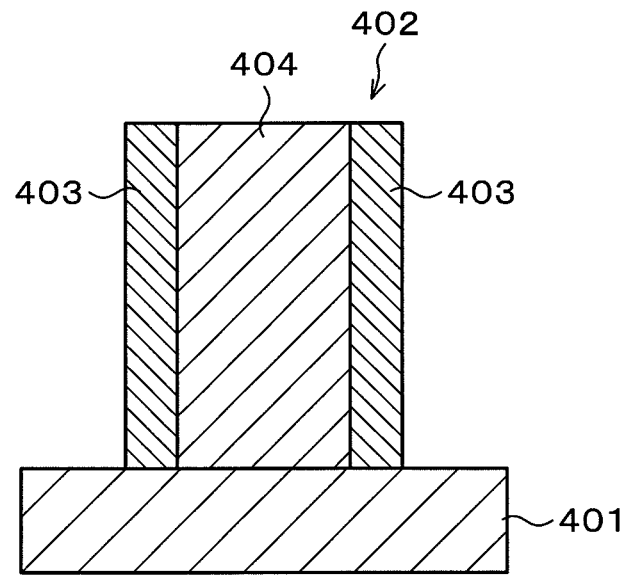
FIG. 9 is an explanatory view illustrating an appearance in which the intermediately exposed region is formed in the side surface of the first resist pattern.

In this event, so-called intermediately exposed regions 403, 403 are formed in both side surfaces of the first resist pattern 402 as illustrated in FIG. 9. The first resist pattern 402 is essentially formed of the remaining resist film which has not been exposed in the exposure apparatus 12, but the side surface of the first resist pattern 402 is actually exposed to a small extent. More specifically, in the side surface of the first resist pattern 402, a region having an intermediate characteristic between a soluble layer and an insoluble layer where a small amount of soluble groups are generated though it should be a region insoluble in the developing solution, namely, the aforementioned intermediately exposed region 403 is formed. Thus, in the intermediately exposed region 403, OH groups (hydroxyl groups) are generated due to the exposure. Further, in the first resist pattern 402, an unexposed region 404 which has not been exposed is formed between the intermediately exposed regions 403, 403. Note that a possible reason why the above-described intermediately exposed region 403 is formed is that it becomes difficult to secure a sufficient contrast in exposure amount at the boundary between the region which is exposed and the region which is not exposed as the semiconductor device becomes increasingly miniaturized.

Then, the wafer W is transferred by the wafer transfer apparatus 70 to the thermal treatment apparatus 40 and subjected to post-baking. Thereafter, the wafer W is transferred by the wafer transfer apparatus 70 to the delivery apparatus 50.

Then, the wafer W is transferred by the wafer transfer apparatus 90 to the delivery apparatus 54. Thereafter, the wafer W is transferred by the wafer transfer apparatus 70 to the metal treatment unit 120 in the coating treatment apparatus 32.

The wafer W transferred to the metal treatment unit 120 is suction-held by the spin chuck 130. Subsequently, the metal-containing solution nozzle 142 at the waiting section 144 is moved by the arm 141 to the position above the central portion of the wafer W. Thereafter, while the wafer W is being rotated by the spin chuck 130, the metal-containing solution is supplied from the metal-containing solution nozzle 142 to the central portion of the wafer W. The metal-containing solution supplied onto the wafer W is diffused over the entire front surface the wafer W by the centrifugal force generated by the rotation of the wafer W.

Figure 10:
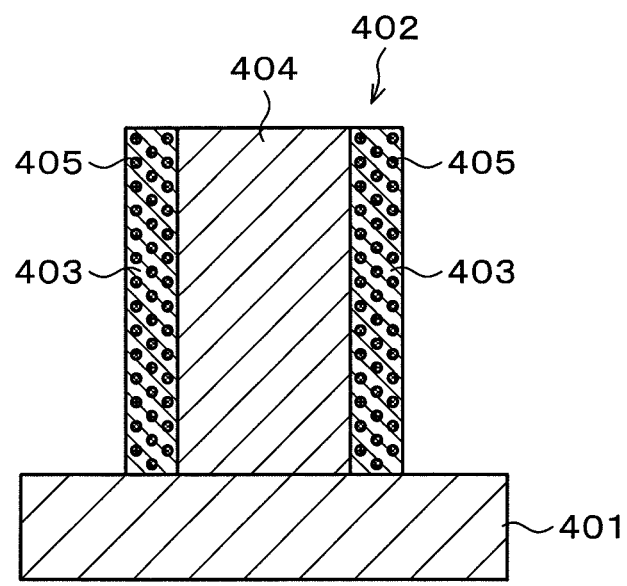
FIG. 10 is an explanatory view illustrating an appearance in which the metal infiltrates the intermediately exposed region of the first resist pattern.

Once the metal-containing solution is applied over the wafer W as described above, the alcohol in the metal-containing solution enters the intermediately exposed region 403 targeting functional groups having affinity therefor such as the OH groups in the intermediately exposed region 403 of the first resist pattern 402. Along with the entrance of the alcohol into the intermediately exposed region 403, metal also enters the intermediately exposed region 403 using the alcohol as an entrance route. Then, the metal bonds with the OH groups in the intermediately exposed region 403, and metal 405 thereby infiltrates the intermediately exposed region 403 as illustrated in FIG. 10. Thus, the intermediately exposed regions 403 being metal-infiltrated layers made by the metal 405 has infiltrated both side surfaces of the first resist pattern 402 are formed as illustrated in FIG. 8(b).

Then, the wafer W is transferred by the wafer transfer apparatus 70 to the delivery apparatus 54, and thereafter transferred by the wafer transfer apparatus 23 in the cassette station 10 to the cassette C on the predetermined cassette mounting plate 21.

After the predetermined treatments are performed on the wafers W in the coating and developing treatment apparatus 2, the cassette C housing the wafers WV is transferred out of the coating and developing treatment apparatus 2 and then transferred into the etching treatment apparatus 3.

In the etching treatment apparatus 3, one wafer W is first taken out of the cassette C on the cassette mounting table 212 by the wafer transfer mechanism 210 and transferred into the load-lock apparatus 213a. After the wafer W is transferred into the load-lock apparatus 213a, the inside of the load-lock apparatus 213a is hermetically closed and reduced in pressure. Thereafter, the inside of the load-lock apparatus 213a is communicated with the inside of the transfer room chamber 214 in a state reduced in pressure relative to the atmospheric pressure (for example, in a substantially vacuum state). The wafer W is then transferred by the wafer transfer mechanism 215 out of the load-lock apparatus 213a and into the transfer room chamber 214.

The wafer W transferred into the transfer room chamber 214 is then transferred by the wafer transfer mechanism 215 into the first etching apparatus 202. In the first etching apparatus 202, an etching treatment is performed on the wafer W using, for example, $O_2$ gas ($O_2$ plasma). In this event, the intermediately exposed region 403 of the first resist pattern 402 contain the metal 405 and is thus higher in etching resistance than the unexposed region 404. Therefore, by performing the etching treatment on the wafer W, only the unexposed region 404 is selectively removed and the intermediately exposed regions 403 remains. Thus, as illustrated in FIG. 8(c), a second resist pattern 406 (intermediately exposed region 403) as another resist pattern is formed over the wafer W.

Then, the wafer W is transferred by the wafer transfer mechanism 215 into the second etching apparatus 204. In the second etching apparatus 204, both of the lower-anti reflection film 401 and the film to be treated 400 on the wafer W are etched using, for example, $O_2$ gas ($O_2$ plasma) and CF gas (CF plasma) and using the second resist pattern 406 over the wafer W as a mask. In this event, since the second resist pattern 406 has a high etching selection ratio with respect to the lower-anti reflection film 401 and the film to be treated 400, a predetermined pattern 407 is formed in an appropriate shape in the lower-anti reflection film 401 and a predetermined pattern 408 is formed in an appropriate shape in the film to be treated 400 as illustrated in FIG. 8(d).

Thereafter, the wafer W is returned again to the transfer room chamber 214 by the wafer transfer mechanism 215. Then, the wafer W is delivered to the wafer transfer mechanism 210 via the load-lock apparatus 213b and housed into the cassette C. Thereafter, the cassette C housing the wafers W is transferred out of the etching treatment apparatus 3, with which a series of wafer treatments end.

According to the above embodiment, OH groups are formed in the intermediately exposed region 403 of the first resist pattern 402. This allows alcohol to enter the intermediately exposed region 403 and allows the metal 405 to enter and infiltrate the intermediately exposed region 403 using the alcohol as an entrance route in the metal treatment unit 120 in the coating treatment apparatus 32. Namely, in the first resist pattern 402, the intermediately exposed region 403 contains the metal 405 and is accordingly higher in etching resistance than the unexposed region 404. This makes it possible to selectively remove only the unexposed region 404 and leave the intermediately exposed region 403 to thereby appropriately form the minute second resist pattern 406 over the wafer W in the first etching apparatus 202. Accordingly, this embodiment is applicable also when manufacturing a miniaturized semiconductor device in recent years and also to so-called double patterning called SaDP (Self Aligned Double Patterning).

In addition, the second resist pattern 406 containing the metal 405 has a high etching selection ratio with respect to the film to be treated 400 on the wafer W. Accordingly, even if the height of a second resist pattern 406 is small (even if the thickness of a resist film is small), the second resist pattern 406 sufficiently fulfills the function as a mask at the time when etching the film to be treated 400 in the second etching apparatus 204. This makes it possible to decrease the aspect ratio of the second resist pattern 406 to thereby suppress the pattern collapse and appropriately form the second resist pattern 406 over the wafer W.

Further, the second resist pattern 406 has a high etching selection ratio with respect to the film to be treated 400 as described above, so that by etching the film to be treated 400 using the second resist pattern 406 as a mask in the second etching apparatus 204, the predetermined pattern 408 can be appropriately formed in the film to be treated 400.

Furthermore, according to this embodiment, it is unnecessary to separately form and etch a silicon film or the like achieving a high etching selection ratio with respect to the film to be treated 400 as in the prior art, but it is only necessary to improve the quality of the first resist pattern 402. Therefore, the wafer treatment can be simplified and the throughput of the wafer treatment can be improved.

In the above embodiment, the infiltration amount of the metal 405 infiltrating the intermediately exposed region 403 of the first resist pattern 402, namely, the concentration of the metal 405 in the intermediately exposed region 403 or the infiltration depth of the metal 405 in the intermediately exposed region 403 is controlled by adjusting, for example, any one or all of the following four parameters. Note that by adjusting these four parameters, the infiltration speed of the metal 405 infiltrating the intermediately exposed region 403 can also be controlled.

The first parameter is, for example, an infiltration time period of the metal 405 in the metal treatment unit 120 in the coating treatment apparatus 32. Increasing the time period during which the metal-containing solution is supplied from the metal-containing solution nozzle 142 makes it possible to increase the time period during which the metal 405 is caused to infiltrate the intermediately exposed region 403 and thereby increase the infiltration amount of the metal 405. On the other hand, decreasing the infiltration time period of the metal 405 makes it possible to decrease the infiltration amount of the metal 405.

The second parameter is, for example, a temperature of alcohol in the metal-containing solution to be supplied from the metal-containing solution nozzle 142 in the metal treatment unit 120 in the coating treatment apparatus 32. Increasing the temperature of alcohol from the metal-containing solution nozzle 142 makes the metal 405 easily infiltrate the intermediately exposed region 403 and thereby makes it possible to increase the infiltration amount of the metal 405. On the other hand, decreasing the temperature of alcohol makes it possible to decrease the infiltration amount of the metal 405.

The third parameter is, for example, an amount of solvent in the first resist pattern 402 to be treated in the metal treatment unit 120 in the coating treatment apparatus 32. For adjusting the amount of solvent, various methods can be used.

For example, at the time when thermal treatment (prebaking treatment) is performed in the thermal treatment apparatus 40 after the resist film is formed over the wafer W in the resist film forming unit 121 in the coating treatment apparatus 32, the temperature or time period of the thermal treatment are adjusted, whereby the amount of solvent in the resist film, namely, the amount of solvent in the first resist pattern 402 can be adjusted. By decreasing the temperature of the thermal treatment or the time period of the thermal treatment, the amount of solvent in the first resist pattern 402 can be increased. This makes it possible to increase the amount of alcohol entering the intermediately exposed region 403 of the first resist pattern 402 and further to increase the infiltration amount of the metal 405 infiltrating the intermediately exposed region 403. On the other hand, by increasing the temperature of the thermal treatment or the time period of the thermal treatment, the amount of solvent in the first resist pattern 402 is decreased. This makes it possible to decrease the amount of alcohol entering the intermediately exposed region 403 and further to decrease the infiltration amount of the metal 405 infiltrating the intermediately exposed region 403.

Further, a solvent may be supplied to the resist film, for example, in a solvent supply apparatus (not illustrated) that is separately provided, to aggressively increase the amount of solvent in the resist film. Further, the amount of solvent in the resist film may be adjusted by changing, for example, the material of the resist solution to be supplied from the resist solution nozzle 162 in the resist film forming unit 121.

The fourth parameter is, for example, an exposure amount (dose amount) in the exposure apparatus 12. By increasing the exposure amount, more OH groups are formed in the intermediately exposed region 403 of the first resist pattern 402. This makes it possible to increase the amount of alcohol entering the intermediately exposed region 403 and further to increase the infiltration amount of the metal 405 infiltrating the intermediately exposed region 403. On the other hand, by decreasing the exposure amount, less OH groups are formed in the intermediately exposed region 403. This makes it possible to decrease the amount of alcohol entering the intermediately exposed region 403 and further to decrease the infiltration amount of the metal 405 infiltrating the intermediately exposed region 403.

The infiltration amount of the metal 405 infiltrating the intermediately exposed region 403 of the first resist pattern 402 can be controlled as described above. Further, the infiltration amount of the metal 405 infiltrating the intermediately exposed region 403 can be controlled in accordance with the etching selection ratio required for the etching treatment in the second etching apparatus 204. Therefore, the etching treatment can be more appropriately performed.

Though the unexposed region 404 of the first resist pattern 402 is removed in the first etching apparatus 202 and the lower-anti reflection film 401 and the film to be treated 400 are etched in the second etching apparatus 204 in the above embodiment, the removal of the unexposed region 404 and the etching treatment on the lower-anti reflection film 401 and the film to be treated 400 may be performed in the same etching apparatus by switching the etching gas.

As the mask at the time when etching the film to be treated 400, the second resist pattern 406 is formed over the wafer W in the above embodiment, but the first resist pattern 402 may be used.

Figure 11:
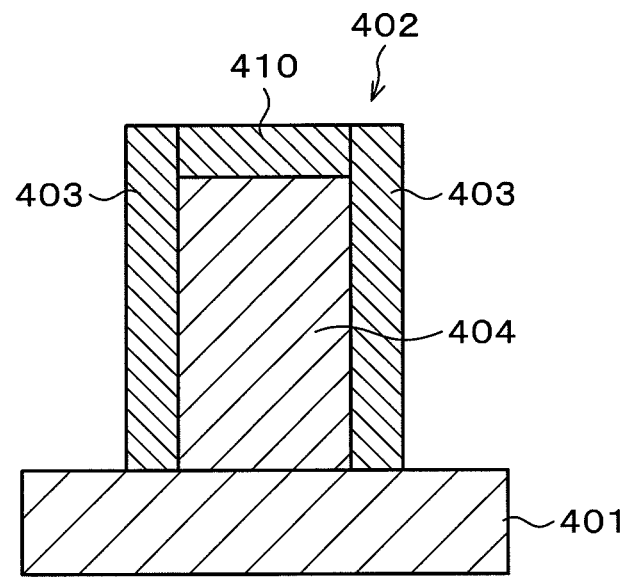
FIG. 11 is an explanatory view illustrating an appearance in which an exposed region is formed in an upper surface of the first resist pattern in another embodiment.

In the side surface of the first resist pattern 402 formed over the wafer W, the intermediately exposed region 403 is formed as illustrated in FIG. 9 in the above embodiment. In this embodiment, the wafer W over which the first resist pattern 402 has been formed as described above is transferred again to the exposure apparatus 12, and only an upper surface of the resist pattern 402 is exposed in the exposure apparatus 12. Thus, an exposed region 410 is formed in the upper surface of the first resist pattern 402 as illustrated in FIG. 11. In the exposed region 410, OH groups are formed. More specifically, OH groups are formed in the intermediately exposed region 403 and the exposed region 410 in the first resist pattern 402. In order to further increase the infiltration amount of the metal into the resist pattern, a UV irradiation unit separate from the exposure apparatus 12 may be provided in the coating and developing treatment apparatus 2 to irradiate the whole resist pattern with, for example, UV light of 172 nm for about 15 seconds so as to protect the whole resist pattern.

The wafer W is subjected to post-baking in the thermal treatment apparatus 40 and then the wafer is transferred to the metal treatment unit 120 in the coating treatment apparatus 32.

In the metal treatment unit 120, while the wafer W suction-held by the spin chuck 130 is being rotated, the metal-containing solution is supplied from the metal-containing solution nozzle 142 to the central portion of the wafer W. The metal-containing solution supplied onto the wafer W is diffused over the entire front surface the wafer W by the centrifugal force generated by the rotation of the wafer W.

Figure 12:
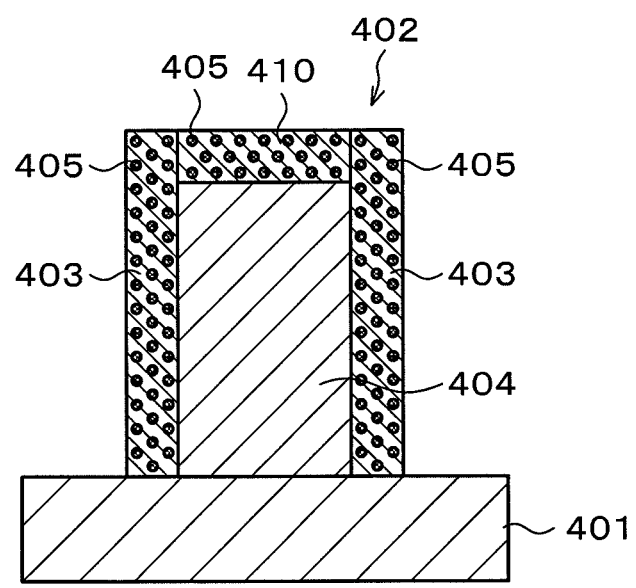
FIG. 12 is an explanatory view illustrating an appearance in which metal infiltrates the intermediately exposed region and the exposed region of the first resist pattern in another embodiment.

Once the metal-containing solution is applied over the wafer W as described above, the alcohol in the metal-containing solution enters the intermediately exposed region 403 and the exposed region 410 targeting functional groups having affinity therefor such as the OH groups in the intermediately exposed region 403 and the exposed region 410 of the first resist pattern 402. Along with the entrance of the alcohol into the intermediately exposed region 403 and the exposed region 410, metal 405 also enters the intermediately exposed region 403 and the exposed region 410 using the alcohol as an entrance route. Then, the metal 405 bonds with the OH groups in the intermediately exposed region 403 and the exposed region 410, and the metal 405 thereby infiltrates the intermediately exposed region 403 and the exposed region 410 as illustrated in FIG. 12. Thus, the intermediately exposed regions 403 and the exposed region 410 which the metal 405 has infiltrated are formed in both side surfaces and the upper surface of the first resist pattern 402 respectively as illustrated in FIG. 13(a).

Then, the wafer W is transferred to the second etching apparatus 204 in the etching treatment apparatus 3. In the second etching apparatus 204, both of the lower-anti reflection film 401 and the film to be treated 400 on the wafer W are etched using, for example, $O_2$ gas ($O_2$ plasma) and CF gas (CF plasma) and using the first resist pattern 402 over the wafer W as a mask. In this event, the upper surface (exposed region 410) and the side surface (intermediately exposed region 403) of the first resist pattern 402 exposed to the etching gas (etching plasma) contain the metal 405 and thus have a high etching selection ratio with respect to the lower-anti reflection film 401 and the film to be treated 400. Therefore, a predetermined pattern 407 can be formed in an appropriate shape in the lower-anti reflection film 401 and a predetermined pattern 408 can be formed in an appropriate shape in the film to be treated 400 as illustrated in FIG. 13(b).

Also in this embodiment, the same effect as that in the above embodiment can be provided. More specifically, the intermediately exposed region 403 and the exposed region 410 of the first resist pattern 402 contain the metal 405 and have a high etching selection ratio with respect to the film to be treated 400, so that even if the height of a first resist pattern 402 is small, the first resist pattern 402 sufficiently fulfills the function as a mask at the time when etching the film to be treated 400. This makes it possible to decrease the aspect ratio of the first resist pattern 402 to thereby suppress the pattern collapse and appropriately form the first resist pattern 402 over the wafer W. Since it is possible to decrease the aspect ratio of the first resist pattern 402, it is further possible to miniaturize the first resist pattern 402.

Further, the first resist pattern 402 has a high etching selection ratio with respect to the film to be treated 400 as described above, so that by etching the film to be treated 400 using the first resist pattern 402 as a mask in the second etching apparatus 204, the predetermined pattern 408 can be appropriately formed in the film to be treated 400.

Furthermore, according to this embodiment, it is unnecessary to separately form and etch a silicon film achieving a high etching selection ratio with respect to the film to be treated 400 as in the prior art, but it is only necessary to improve the quality of the first resist pattern 402. Therefore, the wafer treatment can be simplified and the throughput of the wafer treatment can be improved.

Moreover, there has been a case where an SOC (Spin On Carbon) film and an SiARC (Silicon-containing Anti-Reflective Coating) film are stacked on the film to be treated 400 in this order from the film to be treated 400 side to improve the etching resistance in the prior art. In contrast, in this embodiment, since the etching resistance of the first resist pattern 402 itself is high, it is only necessary to provide only the lower-anti reflection film 401 on the film to be treated 400. In other words, a multilayer composed of three layers in the prior art can be replaced with a bilayer composed of two layers. Accordingly, it is possible to improve the throughput of the wafer treatment and reduce the manufacturing cost of products.

Further, the thickness of the lower-anti reflection film 401 can be arbitrarily set, so that the process margin increases to improve the degree of freedom of the wafer treatment.

Note that since it is unnecessary to remove the unexposed region 404 of the first resist pattern 402 in this embodiment, the same treatment as that in the second etching apparatuses 204, 205 may be performed in the first etching apparatuses 202, 203 in the etching treatment apparatus 3.

In the above embodiment, the case where the intermediately exposed region 403 of the first resist pattern 402 over the wafer W is formed in the side surface of the first resist pattern 402 has been described. In this regard, there is a case where at the time when exposing the resist film over the wafer W in the exposure apparatus 12, the upper surface of the first resist pattern 402 is sometimes slightly exposed because light slightly goes around to below the reticle due to the miniaturization of the pattern in recent years, the material of the resist, the exposure condition or the like. This results in that the intermediately exposed regions 403 are formed both in the upper surface of the side surface of the first resist pattern 402 as illustrated in FIG. 14.

In this case, in the case of using the second resist pattern 406 at the time when etching the film to be treated 400 as illustrated in FIG. 8, it is only necessary to cause the metal 405 to infiltrate the intermediately exposed regions 403 in the upper surface and the side surface of the first resist pattern 402 and then performing, for example, etching treatment thereon to remove the intermediately exposed region 403 in the upper surface of the first resist pattern 402. This makes it possible to form the intermediately exposed region 403 which the metal 405 has infiltrated only in the side surface of the first resist pattern 402 as illustrated in FIG. 8(b).

Figure 14:
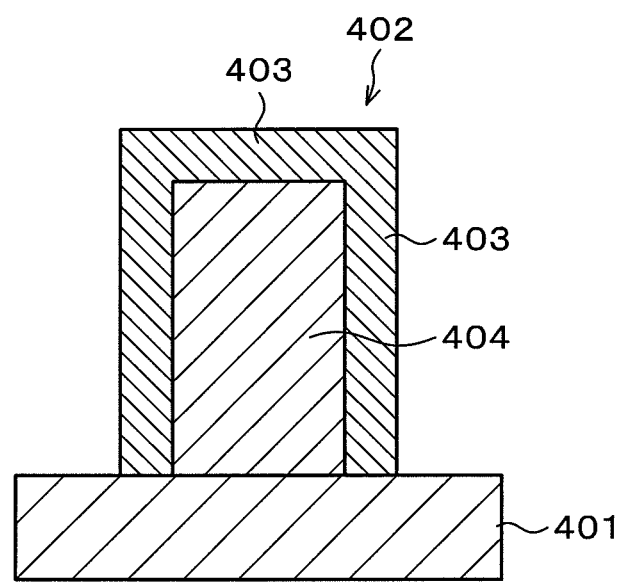
FIG. 14 is an explanatory view illustrating an appearance in which intermediately exposed regions are formed in the upper surface and the side surface of the first resist pattern in another embodiment.

On the other hand, in the case of using the first resist pattern 402 at the time when etching the film to be treated 400 as illustrated in FIG. 13, it is only necessary to use the first resist pattern 402 illustrated in FIG. 14 as it is. In other words, it is unnecessary to form the exposed region 410 by aggressively exposing the upper surface of the first resist pattern 402 as in the above-described embodiment.

Though the metal-containing solution made by dissolving the metal 405 in alcohol is supplied onto the wafer W at the time when the metal 405 is caused to infiltrate the intermediately exposed region 403 (or the exposed region 410) of the first resist pattern 402 in the metal treatment unit 120 in the coating treatment apparatus 32 in the above embodiment, the alcohol and the metal 405 may be separately supplied onto the wafer W.

Figure 15:
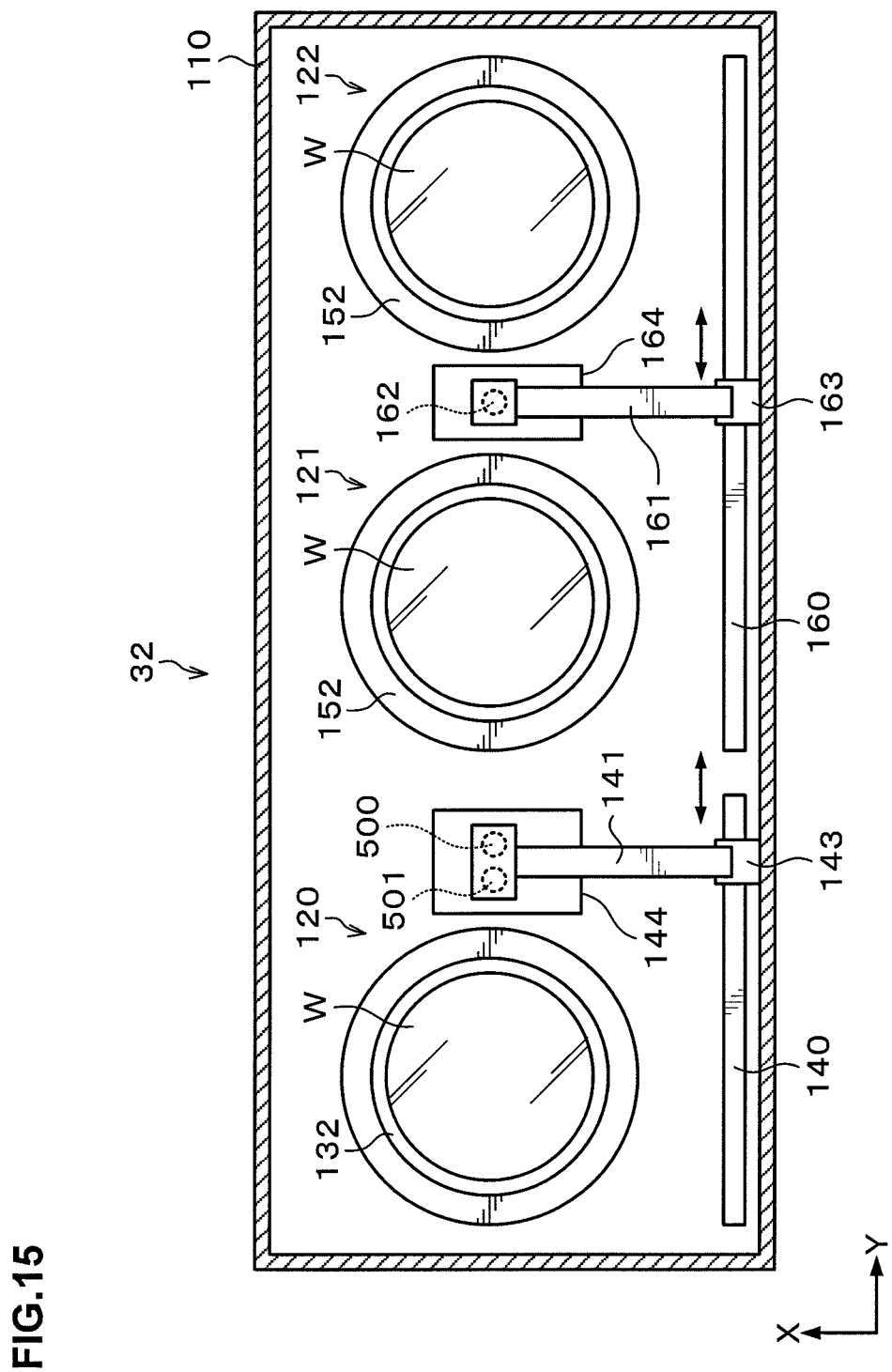
FIG. 15 is a transverse sectional view illustrating the outline of a configuration of a coating treatment apparatus according to another embodiment.
Figure 16:
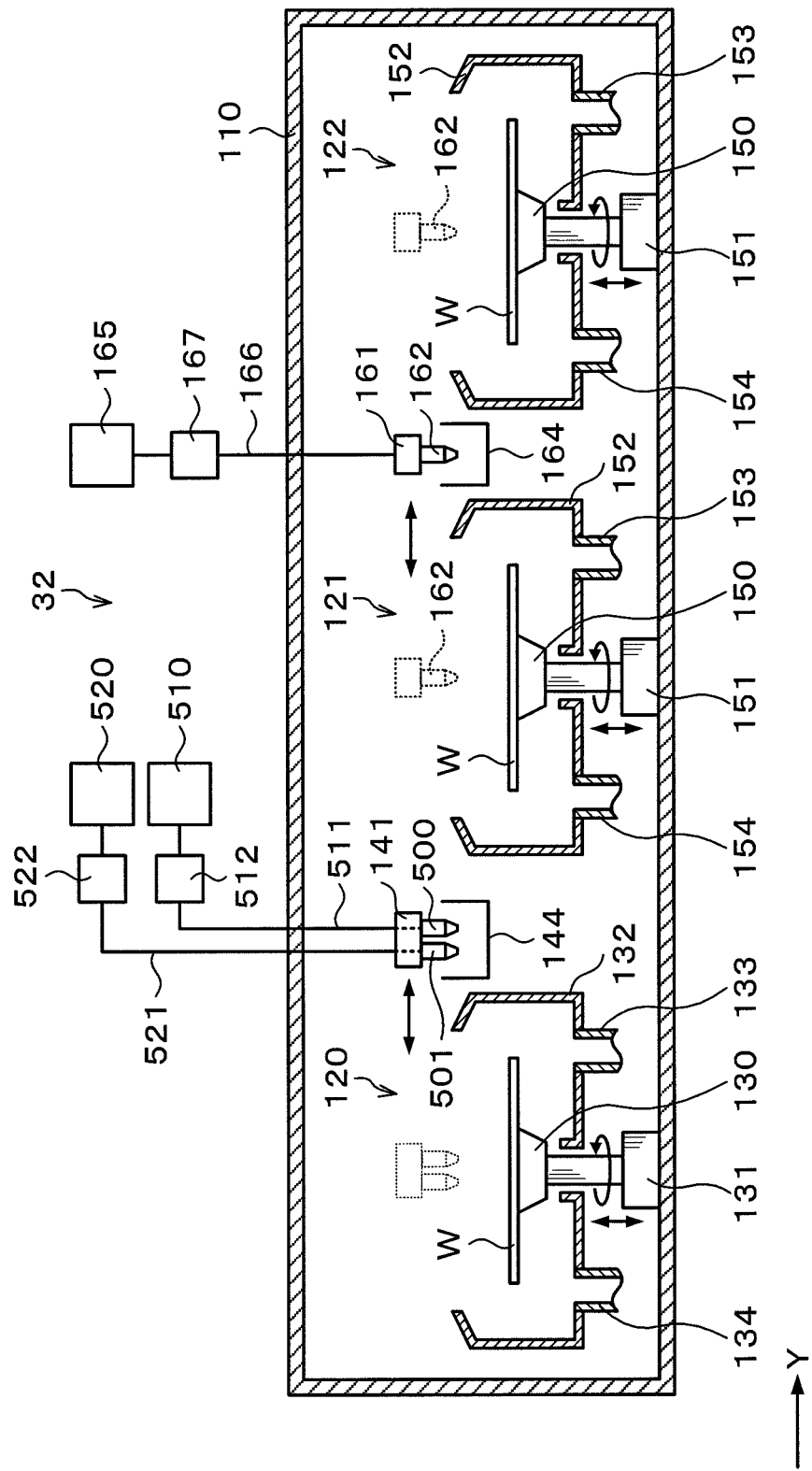
FIG. 16 is a longitudinal sectional view illustrating the outline of the configuration of the coating treatment apparatus according to another embodiment.

As illustrated in FIG. 15 and FIG. 16, an alcohol nozzle 500 as a treatment agent supply part that supplies alcohol in a liquid form as a treatment agent onto the wafer W and a metal-containing solution nozzle 501 as a metal-containing agent supply part that supplies a metal-containing solution in a liquid form as a metal-containing agent containing the metal 405 onto the wafer W are supported on the arm 141 in the metal treatment unit 120.

To the alcohol nozzle 500, a supply pipe 511 communicating with an alcohol supply source 510 is connected as illustrated in FIG. 16. The supply pipe 511 is provided with a supply equipment group 512 including a valve, a flow regulator and so on for controlling the flow of the alcohol. Note that as the alcohol, the same alcohol as in the above embodiment is used.

To the metal-containing solution nozzle 501, a supply pipe 521 communicating with a metal-containing solution supply source 520 is connected. The supply pipe 521 is provided with a supply equipment group 522 including a valve, a flow regulator and so on for controlling the flow of the metal-containing solution. Note that as the metal 405 in the metal-containing solution, the same metal as in the above embodiment is used, but various solvents can be used as the solvent therefor. As the solvent, various materials such as pure water for example can be used as long as the material dissolves the metal 405 and never dissolves the resist film.

The other configuration of the metal treatment unit 120 is the same as that of the metal treatment unit 120 in the above embodiment, and therefore description thereof is omitted. Note that the alcohol nozzle 500 and the metal-containing solution nozzle 501 are supported on the same arm 141 in the above configuration, but may be supported on separate arms.

In the metal treatment unit 120 of this embodiment, after the wafer W is suction-held by the spin chuck 130, the alcohol nozzle 500 at the waiting section 144 is moved by the arm 141 to the position above the central portion of the wafer W. Subsequently, while the wafer W is being rotated by the spin chuck. 130, alcohol is supplied from the alcohol nozzle 500 to the central portion of the wafer W. The alcohol supplied onto the wafer W is diffused over the entire front surface of the wafer W by the centrifugal force generated by the rotation of the wafer W.

Figure 17:
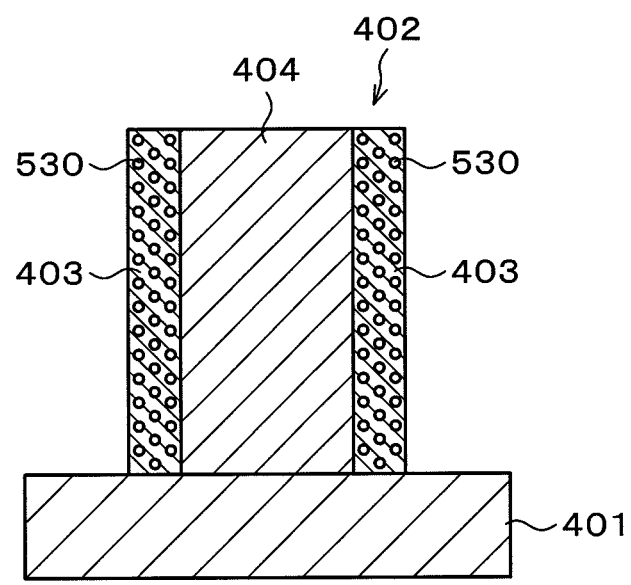
FIG. 17 is an explanatory view illustrating an appearance in which alcohol enters the intermediately exposed region of the first resist pattern in another embodiment.

In this manner, when alcohol is applied over the wafer W, alcohol 530 enters the intermediately exposed region 403 targeting functional groups having affinity therefor such as the OH groups in the intermediately exposed region 403 of the first resist pattern 402 as illustrated in FIG. 17.

Thereafter, the metal-containing solution nozzle 501 is moved by the arm 141 to the position above the central portion of the wafer W. Subsequently, while the wafer W is being rotated by the spin chuck 130, the metal-containing solution is supplied from the metal-containing solution nozzle 501 to the central portion of the wafer W. The metal-containing solution supplied onto the wafer W is diffused over the entire front surface of the wafer W by the centrifugal force generated by the rotation of the wafer W.

When the metal-containing solution is applied over the wafer W as described above, the metal-containing solution enters the intermediately exposed region 403 using the alcohol 530 in the intermediately exposed region 403 as an entrance route. Then, the metal 405 in the metal-containing solution bonds with the OH groups in the intermediately exposed region 403, and the metal 405 infiltrates the intermediately exposed region 403 as illustrated in FIG. 10.

Also in this case, the second resist pattern 406 can be appropriately formed over the wafer W as illustrated in FIG. 8 and the first resist pattern 402 can be appropriately formed over the wafer W as illustrated in FIG. 13. Accordingly, the same effect as that in the above embodiment can be provided.

For causing the metal 405 to infiltrate the intermediately exposed region 403 as described above, the metal-containing solution made by dissolving the metal 405 in the alcohol 530 may be supplied onto the wafer W, or the alcohol 530 and the metal 405 may be separately supplied onto the wafer W, in any of which cases, the same effect can be provided. Incidentally, it is more preferable to supply the metal-containing solution made by dissolving the metal 405 in the alcohol 530 onto the wafer W as in the former case from the viewpoint of throughput.

The metal-containing solution supplied from the metal-containing solution nozzle 142 to the wafer W is in a liquid form in the above embodiment but may be in a gas form. A coating treatment apparatus 600 that supplies the metal-containing agent in the gas form can be installed at any place in the coating and developing treatment apparatus 2, and installed, for example, in the first block G1.

Figure 18:
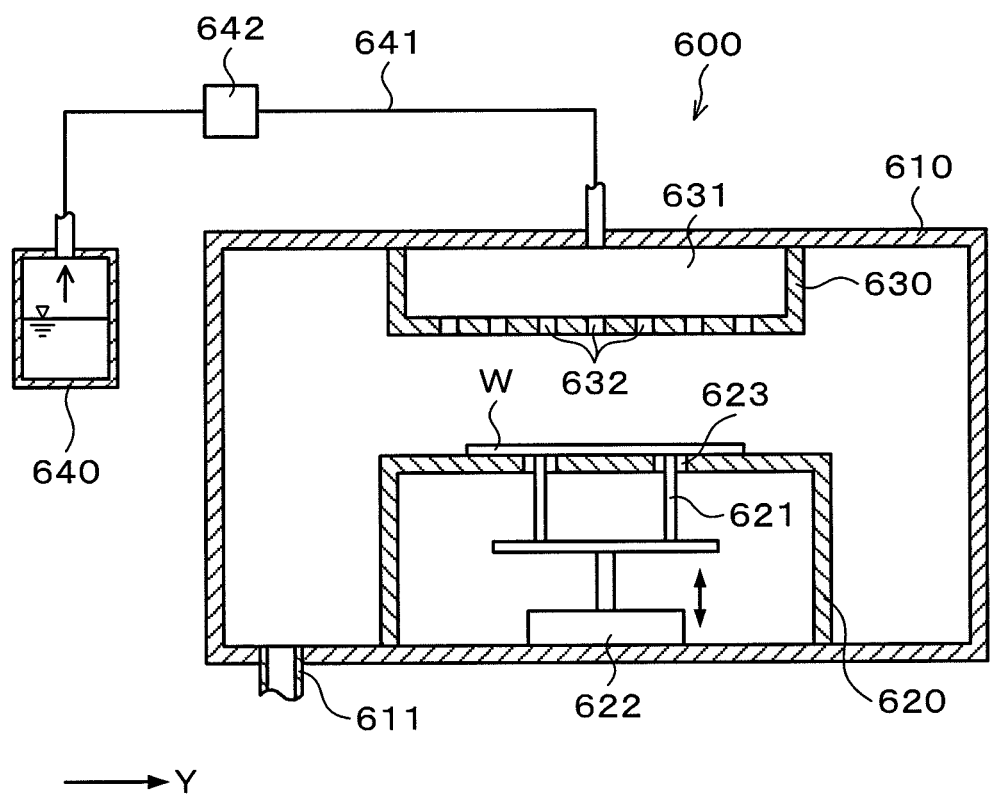
FIG. 18 is a longitudinal sectional view illustrating the outline of a configuration of a coating treatment apparatus according to another embodiment.

The coating treatment apparatus 600 has a treatment container 610 which can hermetically close the inside as illustrated in FIG. 18. A transfer-in/out port (not illustrated) for the wafer W is formed, for example, in a side surface on the wafer transfer region D side of the treatment container 610, and an opening/closing shutter (not illustrated) is provided at the transfer-in/out port. To the bottom surface of the treatment container 610, an exhaust pipe 611 that exhausts the atmosphere therein is connected.

At the bottom surface in the treatment container 610, a mounting table 620 on which the wafer W is mounted is provided. In the mounting table 620, for example, three raising and lowering pins 621 are provided for supporting the wafer W from below and raising and lowering the wafer W. The raising and lowering pins 621 can move up and down by means of a raising and lowering drive part 622. In the upper surface of the mounting table 620, through holes 623 penetrating the upper surface in the thickness direction are formed, for example, at three positions. The raising and lowering pins 621 are inserted into the through holes 623.

On the ceiling surface in the treatment container 610 and above mounting table 620, a shower head 630 that supplies a metal-containing agent in a gas form downward onto the wafer W is provided. The shower head 630 is arranged to face the wafer W mounted on the mounting table 620. Inside the shower head 630, an inner space 631 is formed, into which the metal-containing agent supplied from a later-described metal-containing agent supply source 640 is introduced. At the lower surface of the shower head 630, a plurality of supply ports 632 that supply downward the metal-containing agent introduced into the inner space 631 are provided, distributed over the entire lower surface of the shower head 630. In short, the plurality of supply ports 632 are formed so that the metal-containing agent in a gas form is supplied from the shower head 630 to the wafer W uniformly within the horizontal plane.

To the shower head 630, a supply pipe 641 communicating with the metal-containing agent supply source 640 is connected. In the metal-containing agent supply source 640, the metal-containing solution made by dissolving the metal 405 in the alcohol 530 is stored in a liquid form, and the metal-containing solution is heated to evaporate so as to form into the metal-containing agent in a gas form. The supply pipe 641 is provided with a supply equipment group 642 including a valve, a flow regulator and so on for controlling the flow of the metal-containing agent.

In this case, the wafer W over which the first resist pattern 402 has been formed is transferred by the wafer transfer apparatus 70 to the coating treatment apparatus 600. After the wafer W is transferred into the coating treatment apparatus 600, the wafer W is delivered to the raising and lowering pins 621 which have been raised and waiting in advance. Subsequently, the raising and lowering pins 621 are lowered to mount the wafer W on the mounting table 620. Thereafter, the metal-containing agent in a gas form is supplied from the shower head 630 onto the wafer W. Then, the alcohol 530 enters the intermediately exposed region 403 (or the exposed region 410) of the first resist pattern 402, and the metal 405 enters the intermediately exposed region 403 using the alcohol 530 as an entrance route. This makes it possible to cause the metal 405 to infiltrate the intermediately exposed region 403.

Similarly, each of the alcohol 530 supplied from the alcohol nozzle 500 and the metal-containing solution supplied from the metal-containing solution nozzle 501 is in a liquid form but may be in a gas form. Even in this case, the same apparatus as the coating treatment apparatus 600 can be used to supply the alcohol 530 in a gas form and the metal-containing agent in a gas form onto the wafer W to thereby cause the metal 405 to infiltrate the intermediately exposed region 403 of the first resist pattern 402.

The metal treatment unit 120 and the resist film forming units 121, 122 are provided in the same coating treatment apparatus 32 in the above embodiment, but may be provided in separate apparatuses.

Though alcohol is used as a treatment agent to cause the meal 405 to enter the intermediately exposed region 403 (or the exposed region 410) of the first resist pattern 402 in the above embodiment, the material is not limited to alcohol as long as the material enters the intermediately exposed region 403.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention.

What is claimed is:

1. A substrate treatment method of forming a resist pattern over a substrate, the method comprising:
   a resist pattern forming step of performing photolithography processing on a substrate to form a resist pattern over the substrate, wherein the resist pattern has a side surface; and
   a metal treatment step of supplying a treatment agent which includes alcohol to the side surface of the resist pattern so as to cause the treatment agent to enter the side surface of the resist pattern and to cause metal carried with the treatment agent to infiltrate the side surface of the resist pattern via the treatment agent and to bond with functional groups which have an affinity for alcohol and which are in the side surface of the resist pattern,
   wherein, in the substrate treated by the metal treatment step, the resist pattern is formed with at least two side surfaces which the metal has infiltrated, an un-infiltrated portion of the resist pattern being located between the at least two side surfaces of the resist pattern, the un-infiltrated portion is not infiltrated by the metal,
   further comprising, after the metal treatment step, removing the un-infiltrated portion of the resist pattern being located between the at least two side surfaces and which the metal has not infiltrated, leaving the at least two side surfaces which the metal has infiltrated to form another resist pattern over the substrate,
   wherein an infiltration amount of the metal infiltrating the resist pattern in the metal treatment step is controlled by adjusting at least a time period during which the metal is caused to infiltrate in the metal treatment step, an amount of solvent in the resist pattern treated in the metal treatment step, or an exposure amount at time when exposing the resist film in the resist pattern forming step.

2. The substrate treatment method according to claim 1, wherein in the metal treatment step, the treatment agent is further caused to enter an upper surface of the resist pattern and the metal is caused to infiltrate the upper surface of the resist pattern via the treatment agent.

3. The substrate treatment method according to claim 1, wherein in the metal treatment step, a metal-containing agent containing the metal in the treatment agent is supplied onto the substrate and the metal-containing agent is caused to enter the side surface of the resist pattern so as to cause the metal to infiltrate the side surface of the resist pattern.

4. The substrate treatment method according to claim 3, wherein in the metal treatment step, the metal-containing agent is supplied in a liquid form or in a gas form onto the substrate.

5. The substrate treatment method according to claim 1, wherein in the metal treatment step, after the treatment agent which includes alcohol is supplied onto the substrate and the treatment agent is caused to enter the side surface of the resist pattern, a metal-containing agent containing the metal is supplied onto the substrate and then the metal is carried with the treatment agent to infiltrate the side surface of the resist pattern.

6. The substrate treatment method according to claim 5, wherein in the metal treatment step, the treatment agent and the metal-containing agent are supplied each in a liquid form or in a gas form onto the substrate.

7. The substrate treatment method according to claim 1, wherein, in the metal treatment step, the treatment agent which is supplied to the resist pattern includes the metal which is dissolved in the alcohol included in the treatment agent, or the metal in a liquid form and the treatment agent which includes alcohol are separately supplied to the resist pattern.

8. The substrate treatment method according to claim 1, wherein, in the substrate treated by the metal treatment step, the resist pattern includes lines which are spaced apart from each other, and a line of the resist pattern includes the at least two side surfaces and the un-infiltrated portion, the un-infiltrated portion is on an inside of the line, the un-infiltrated portion is sandwiched between the at least two side surfaces of the line of the resist pattern,
wherein, in the substrate after removing the un-infiltrated portion of the resist pattern, the un-infiltrated portion is removed from the inside of the line to leave the at least two side surfaces of the line spaced apart from each other and spaced apart from the side surfaces of other lines, in the another resist pattern.

9. A non-transitory computer readable storage medium storing a program running on a computer of a control unit that controls a substrate treatment system to cause the substrate treatment system to execute a substrate treatment method of forming a resist pattern over a substrate,
   the substrate treatment method comprising:
   a resist pattern forming step of performing photolithography processing on a substrate to form a resist pattern over the substrate, wherein the resist pattern has a side surface; and
   a metal treatment step of supplying a treatment agent which includes alcohol to the side surface of the resist pattern so as to cause the treatment agent to enter the side surface of the resist pattern and to cause metal carried with the treatment agent to infiltrate the side surface of the resist pattern via the treatment agent and to bond with functional groups which have an affinity for alcohol and which are in the side surface of the resist pattern,
   wherein, in the substrate treated by the metal treatment step, the resist pattern is formed with at least two side surfaces which the metal has infiltrated, an un-infiltrated portion of the resist pattern being located between the at least two side surfaces of the resist pattern, the un-infiltrated portion is not infiltrated by the metal,
   further comprising, after the metal treatment step, removing the un-infiltrated portion of the resist pattern being located between the at least two side surfaces and which the metal has not infiltrated, leaving the at least two side surfaces which the metal has infiltrated to form another resist pattern over the substrate, wherein an infiltration amount of the metal infiltrating the resist pattern in the metal treatment step is controlled by adjusting at least a time period during which the metal is caused to infiltrate in the metal treatment step, an amount of solvent in the resist pattern treated in the metal treatment step, or an exposure amount at time when exposing the resist film in the resist pattern forming step.

10. The non-transitory computer readable storage medium according to claim 9, wherein, in the substrate treated by the metal treatment step, the resist pattern includes lines which are spaced apart from each other, and a line of the resist pattern includes the at least two side surfaces and the un-infiltrated portion, the un-infiltrated portion is on an inside of the line, the un-infiltrated portion is sandwiched between the at least two side surfaces of the line of the resist pattern, wherein, in the substrate after removing the un-infiltrated portion of the resist pattern, the un-infiltrated portion is removed from the inside of the line to leave the at least two side surfaces of the line spaced apart from each other and spaced apart from the side surfaces of other lines, in the another resist pattern.

11. A substrate treatment system for forming a resist pattern over a substrate, the system comprising:

a resist film forming apparatus configured to form a resist film over a substrate;

an exposure apparatus configured to expose the resist film formed in the resist film forming apparatus;

a developing apparatus configured to develop the resist film exposed in the exposure apparatus to form a resist pattern over the substrate, wherein the resist pattern has a side surface;

a metal treatment apparatus configured to supply a treatment agent which includes alcohol to the side surface of the resist pattern so as to cause the treatment agent to enter the side surface of the resist pattern and to cause metal carried with the treatment agent to infiltrate the side surface of the resist pattern via the treatment agent and to bond with functional groups which have an affinity for alcohol and which are in the side surface of the resist pattern; and a control unit, wherein, in the substrate treated by the metal treatment apparatus, the resist pattern is formed with at least two side surfaces which the metal has infiltrated, an un-infiltrated portion of the resist pattern being located between the at least two side surfaces of the resist pattern, the un-infiltrated portion is not infiltrated by the metal, further comprising:

a resist pattern removing apparatus configured to remove the un-infiltrated portion of the resist pattern being located between the at least two side surfaces and which the metal has not infiltrated, to leave the at least two side surfaces which the metal has infiltrated that form another resist pattern over the substrate, wherein the control unit is configured to control an infiltration amount of the metal infiltrating the resist pattern in the metal treatment apparatus by adjusting at least a time period during which the metal is caused to infiltrate in the metal treatment apparatus, an amount of solvent in the resist pattern treated in the metal treatment apparatus, or an exposure amount in the exposure apparatus.

12. The substrate treatment system according to claim 11, wherein the metal treatment apparatus further causes the treatment agent to enter an upper surface of the resist pattern and causes the metal to infiltrate the upper surface of the resist pattern via the treatment agent.

13. The substrate treatment system according to claim 11, wherein the metal treatment apparatus comprises a metal-containing agent supply part configured to supply a metal-containing agent containing the metal in the treatment agent onto the substrate.

14. The substrate treatment system according to claim 13, wherein the metal-containing agent supply part supplies the metal-containing agent in a liquid form or in a gas form onto the substrate.

15. The substrate treatment system according to claim 11, wherein the metal treatment apparatus comprises a treatment agent supply part configured to supply the treatment agent onto the substrate, and a metal-containing agent supply part configured to supply a metal-containing agent containing the metal onto the substrate.

16. The substrate treatment system according to claim 15, wherein the treatment agent supply part and the metal-containing agent supply part supply the treatment agent and the metal-containing agent each in a liquid form or in a gas form onto the substrate.

17. The substrate treatment system according to claim 11, wherein the metal treatment apparatus is further configured that the treatment agent which is supplied to the resist pattern includes the metal which is dissolved in the alcohol included in the treatment agent, or the metal in a liquid form and the treatment agent which includes alcohol are separately supplied to the resist pattern.

18. The substrate treatment system according to claim 11, wherein, in the substrate treated by the metal treatment apparatus, the resist pattern includes lines which are spaced apart from each other, and a line of the resist pattern includes the at least two side surfaces and the un-infiltrated portion, the un-infiltrated portion is on an inside of the line, the un-infiltrated portion is sandwiched between the at least two side surfaces of the line of the resist pattern, wherein, in the substrate after removing the un-infiltrated portion of the resist pattern, the un-infiltrated portion is removed from the inside of the line to leave the at least two side surfaces of the line spaced apart from each other and spaced apart from the side surfaces of other lines, in the another resist pattern.

* * * * *